US011956989B2

(12) United States Patent
Gong et al.

(10) Patent No.: US 11,956,989 B2
(45) Date of Patent: Apr. 9, 2024

(54) DISPLAY APPARATUS HAVING DAM MEMBERS

(71) Applicant: Samsung Display Co., Ltd., Yongin-si (KR)

(72) Inventors: Sucheol Gong, Cheonan-si (KR); Sungwoo Jung, Cheonan-si (KR); Hun Kim, Seoul (KR); Kyungchan Chae, Hwaseong-si (KR)

(73) Assignee: Samsung Display Co., Ltd., Yongin-si (KR)

(*) Notice: Subject to any disclaimer, the term of this patent is extended or adjusted under 35 U.S.C. 154(b) by 237 days.

(21) Appl. No.: 17/216,437

(22) Filed: Mar. 29, 2021

(65) Prior Publication Data

US 2021/0217994 A1    Jul. 15, 2021

Related U.S. Application Data

(62) Division of application No. 16/226,384, filed on Dec. 19, 2018, now Pat. No. 10,978,671.

(30) Foreign Application Priority Data

Dec. 28, 2017   (KR) .................. 10-2017-0183048

(51) Int. Cl.
  *H10K 50/844*   (2023.01)
  *H10K 50/842*   (2023.01)
  (Continued)

(52) U.S. Cl.
  CPC ....... *H10K 50/844* (2023.02); *H10K 50/8426* (2023.02); *H10K 50/8445* (2023.02);
  (Continued)

(58) Field of Classification Search
  CPC ............... H10K 50/844; H10K 59/122; H10K 50/8445; H10K 59/88; H10K 59/124; H10K 50/8426
  (Continued)

(56) References Cited

U.S. PATENT DOCUMENTS 9,412,972 B2 * 8/2016 Shim .................. H10K 50/8445
9,658,650 B2    5/2017 Cho
(Continued)

FOREIGN PATENT DOCUMENTS

CN    104133327    11/2014
CN    205789979    12/2016
(Continued)

OTHER PUBLICATIONS

Non-Final Office Action dated Aug. 19, 2020, issued to U.S. Appl. No. 16/226,384.
(Continued)

*Primary Examiner* — Jami Valentine Miller
(74) *Attorney, Agent, or Firm* — H.C. Park & Associates, PLC

(57) ABSTRACT

A display apparatus includes: a substrate having a display area and a non-display area at least partially surrounding the display area; a plurality of pixels disposed in the display area of the substrate; a plurality of first projections disposed in the non-display area of the substrate extending along an edge of the substrate; and a second projection disposed on the substrate between the plurality of first projections and the display area, the second projection including a plurality of cavities arranged in a plurality of columns to limit flow of excess organic material during manufacture, wherein the cavities may be arranged in adjacent columns staggered from each other in a direction transverse to the columns.

20 Claims, 18 Drawing Sheets

(51) Int. Cl.
  *H10K 59/122* (2023.01)
  *H10K 59/124* (2023.01)
  *H10K 59/88* (2023.01)

(52) U.S. Cl.
  CPC ......... *H10K 59/122* (2023.02); *H10K 59/124* (2023.02); *H10K 59/88* (2023.02)

(58) Field of Classification Search
  USPC .......................................................... 257/40
  See application file for complete search history.

(56) References Cited

U.S. PATENT DOCUMENTS

| | | | |
|---|---|---|---|
| 9,817,275 | B2 | 11/2017 | Oh et al. |
| 9,818,807 | B2* | 11/2017 | Park .................... H10K 59/124 |
| 9,864,225 | B2* | 1/2018 | Hong .................. G02F 1/13394 |
| 9,971,205 | B2 | 5/2018 | Huang et al. |
| 10,026,793 | B2 | 7/2018 | Jeon |
| 10,128,463 | B2 | 11/2018 | Furuie |
| 11,108,003 | B2 | 8/2021 | Seo et al. |
| 2004/0178730 | A1 | 9/2004 | Shinoda et al. |
| 2015/0171367 | A1 | 6/2015 | Moon |
| 2016/0306203 | A1* | 10/2016 | Lee .................. G02F 1/133377 |

FOREIGN PATENT DOCUMENTS

| | | |
|---|---|---|
| CN | 106896586 | 6/2017 |
| CN | 107104124 | 8/2017 |
| CN | 107195803 | 9/2017 |
| KR | 10-2015-0027407 | 3/2015 |
| KR | 10-2015-0071538 | 6/2015 |
| KR | 10-2016-0087982 | 7/2016 |
| KR | 10-2016-0105652 | 9/2016 |
| KR | 10-2016-0110688 | 9/2016 |
| KR | 10-2016-0123424 | 10/2016 |
| KR | 10-2016-0124301 | 10/2016 |
| KR | 10-2017-0051815 | 5/2017 |
| KR | 10-2017-0090382 | 8/2017 |
| KR | 10-2017-0127100 | 11/2017 |

OTHER PUBLICATIONS

Notice of Allowance dated Dec. 11, 2020, issued to U.S. Appl. No. 16/226,384.

* cited by examiner

DISPLAY APPARATUS HAVING DAM MEMBERS

CROSS-REFERENCE TO RELATED APPLICATION

This application is a division of U.S. patent application Ser. No. 16/226,384, filed on Dec. 19, 2018, which claims priority from and the benefit of Korean Patent Application No. 10-2017-0183048, filed on Dec. 28, 2017, which is hereby incorporated by reference for all purposes as if fully set forth herein.

BACKGROUND

Field

Exemplary embodiments of the invention relate generally to a display apparatus and, more specifically, to a display apparatus including dam members to reduce overflow of an organic material used to make a layer or component in the display.

Discussion of the Background

Among display apparatuses, an organic light emitting display apparatus displays an image using a plurality of organic light emitting elements that emit a light by recombination of electrons and holes. Compared to a liquid crystal display apparatus, the organic light emitting display apparatus does not need a separate light source and has various advantages, e.g., a superior brightness, a superior viewing angle, a fast response time, a low power consumption, etc.

To manufacture the organic light emitting display apparatus, a plurality of pixels including the organic light emitting elements are formed on a substrate, and then, a thin film encapsulation layer is provided on the substrate to cover the plurality of pixels. The thin film encapsulation layer includes an inorganic insulating layer and an organic insulating layer. A liquid organic material is provided on a substrate and cured to form the organic insulating layer. If excessive amounts of liquid organic material is applied onto the substrate, the liquid organic material overflows the substrate.

The above information disclosed in this Background section is only for understanding of the background of the inventive concepts, and, therefore, it may contain information that does not constitute prior art.

SUMMARY

Display apparatus and methods of manufacturing display apparatus constructed according to the principles and exemplary embodiments of the inventions reduce or prevent overflow of an organic material used to make a layer or component in the display. Avoiding excess organic material from flowing to other parts of the display and/or overflowing the substrate increases the reliability and/or operating performance of the display and may obviate additional processing steps required to removed the excess organic material.

Additional features of the inventive concepts will be set forth in the description which follows, and in part will be apparent from the description, or may be learned by practice of the inventive concepts.

According to one or more embodiments of the invention, a display apparatus includes: a substrate having a display area and a non-display area at least partially surrounding the display area; a plurality of pixels disposed in the display area of the substrate; a plurality of first projections disposed in the non-display area of the substrate extending along an edge of the substrate; and a second projection disposed on the substrate between the plurality of first projections and the display area, the second projection including a plurality of cavities arranged in a plurality of columns to limit flow of excess organic material during manufacture, wherein the cavities may be arranged in adjacent columns staggered from each other in a direction transverse to the columns.

The second projection may include a dummy dam member disposed on the substrate as a single layer.

The second projection may include organic material.

The second projection may have a width greater than a width of each of the plurality of first projections.

The first projections may include dam members and the second projection may include a dummy dam member, each dam member including: a first dam member having a height higher than a height of the dummy dam member; and a second dam member having a height higher than the height of the first dam member, wherein the second dam member may be disposed adjacent to the edge of the substrate, and wherein the first dam member may be disposed between the dummy dam member and the second dam member.

The first dam member may include: a first dam insulating layer disposed on the substrate; a second dam insulating layer disposed on the first dam insulating layer; and a third dam insulating layer disposed on the second dam insulating layer.

The second dam member may include: a fourth dam insulating layer disposed on the substrate; a fifth dam insulating layer disposed on the fourth dam insulating layer; a sixth dam insulating layer disposed on the fifth dam insulating layer; and a seventh dam insulating layer disposed on the sixth dam insulating layer.

Each of the first dam insulating layer, the second dam insulating layer, the third dam insulating layer, the fourth dam insulating layer, the fifth dam insulating layer, the sixth dam insulating layer, and the seventh dam insulating layer may include organic material.

The cavities may include holes and the second projection may include: a body portion in which the holes are defined, the body portion at least partially surrounding the display area; and a plurality of protruding portions extending from one side of the body portion facing the display area.

The plurality of protruding portions may be staggered in a transverse direction with respect to the cavities arranged in a column adjacent to the plurality of protruding portions.

Each of the plurality of protruding portions may have at least one of a rectangular shape, a triangular shape, and a semicircular shape.

Adjacent protruding portions may have different sizes from each other.

The display may further include: an insulating layer disposed in the display area of the substrate and extending to the non-display area adjacent to the first projection; and a thin film encapsulation layer covering the plurality of pixels, wherein the plurality of pixels may include: a plurality of transistors disposed on the substrate; and a plurality of light emitting elements connected to the plurality of transistors, wherein the insulating layer may be disposed on the plurality of transistors, wherein the plurality of light emitting elements may be disposed on the insulating layer and connected to the plurality of transistors through a plurality of contact holes defined through the insulating layer, and wherein the thin film encapsulation layer may be disposed on the plurality of light emitting elements.

The thin film encapsulation layer may include: a first encapsulation layer disposed on the substrate to cover the plurality of light emitting elements in the display area and the insulating layer, the second projection, and the plurality of first projections in the non-display area; a second encapsulation layer disposed on the first encapsulation layer in the display area and extending to the non-display area, the second encapsulation layer being disposed on a portion of the insulating layer adjacent to a boundary of the insulating layer in the non-display area; and a third encapsulation layer disposed on the first encapsulation layer to cover the second encapsulation layer.

Each of the first and third encapsulation layers may include an inorganic material and the second encapsulation layer may include an organic material and the cavities are configured to receive excessive organic material from the second encapsulation layer.

The second projection may be disposed between the boundary of the insulating layer and the plurality of first projections The second projection may be disposed on the insulating layer and between the boundary of the insulating layer and a boundary of the second encapsulation layer.

According to one or more exemplary embodiments of the invention, a display apparatus includes: a substrate having a display area and a non-display area at least partially surrounding the display area; a plurality of pixels disposed in the display area of the substrate; a plurality of first members disposed in the non-display area of the substrate extending along an edge of the substrate; and a plurality of second members disposed on the substrate between the plurality of first members and the display area, each of the plurality of second members including: a side wall portion extending to surround the display area; and a plurality of protruding portions projecting from one side of the side wall portion facing the display area.

Each of the plurality of protruding portions may have at least one shape of a rectangular shape, a triangular shape, and a semicircular shape.

Adjacent protruding portions may have different sizes from each other.

The plurality of second members may include a plurality of dummy dam members, and the plurality of first members may include a plurality of dam members, each of the plurality of dam members including: a first dam member having a height higher than a height of each of the plurality of dummy dam members; and a second dam member having a height higher than the height of the first dam member, wherein the second dam member may be disposed adjacent to the edge of the substrate, and wherein the first dam member may be disposed between the plurality of dummy dam members and the second dam member.

Each of the plurality of dummy dam members may have a thickness in a range of about 2 micrometers ($\mu$m) to about 5 micrometers ($\mu$m), wherein the thickness of each of the plurality of dummy dam members may be defined by a distance between a bottom surface and a top surface of each of the plurality of dummy dam members, and wherein each of the plurality of dummy dam members may have a width greater than or equal to about 10 micrometers ($\mu$m), wherein the width of each of the plurality of dummy dam members may be defined by a distance between one side surface and the other side surface of each of the plurality of dummy dam members.

The plurality of second members may include a plurality of dummy dam members, each of which may include: a first dummy dam member; and a second dummy dam member disposed between the first dummy dam member and the plurality of dam members, wherein the plurality of protruding portions of the first dummy dam member may be alternately arranged with the plurality of protruding portions of the second dummy dam member.

The display apparatus may further include: an insulating layer disposed in the display area of the substrate and extending to the non-display area adjacent to the plurality of second members; and a thin film encapsulation layer covering the plurality of pixels, wherein the plurality of pixels may include: a plurality of transistors disposed on the substrate; and a plurality of light emitting elements connected to the plurality of transistors, wherein the insulating layer may be disposed on the plurality of transistors, wherein the plurality of light emitting elements may be disposed on the insulating layer and connected to the plurality of transistors through a plurality of contact holes defined through the insulating layer, and wherein the thin film encapsulation layer may be disposed on the plurality of light emitting elements.

The thin film encapsulation layer may include: a first encapsulation layer disposed on the substrate to cover the plurality of light emitting elements in the display area and the insulating layer, the plurality of second members, and the plurality of first members in the non-display area; a second encapsulation layer disposed on the first encapsulation layer in the display area and extending to the non-display area, the second encapsulation layer being disposed on a portion of the insulating layer adjacent to a boundary of the insulating layer in the non-display area; and a third encapsulation layer disposed on the first encapsulation layer to cover the second encapsulation layer.

The plurality of second members may be disposed between the boundary of the insulating layer and the plurality of first members.

The plurality of second members may be disposed on the insulating layer and between the boundary of the insulating layer and a boundary of the second encapsulation layer.

According to one or more exemplary embodiments of the invention, a display apparatus includes: a substrate having a display area and a non-display area at least partially surrounding the display area; a plurality of pixels disposed in the display area of the substrate; and a plurality of first members disposed in the non-display area of the substrate extending along an edge of the substrate, each of the plurality of first members including: a side wall portion extending to surround the display area; and a plurality of protruding portions extending from one side of the side wall portion facing the display area, wherein at least one of the side wall portion and the protruding portions may be configured to limit flow or excessive organic material during manufacture.

The plurality of first members may include dam members, each of which may include: a first dam member; and a second dam member having a height higher than a height of the first dam member, wherein the second dam member may be disposed adjacent to the edge of the substrate, wherein the first dam member may be disposed between the display area and the second dam member, and wherein the plurality of protruding portions of the first dam member may be staggered in a transverse direction with the plurality of protruding portions of the second dam member.

According to yet another exemplary embodiment of the invention, a method for manufacturing a display apparatus includes the steps of: forming a substrate having a display area containing pixels and a non-display area; forming a first projection in the non-display area along an edge of the substrate; forming a second projection in the non-display area between the first projections and the pixels, the second projection comprising: cavities arranged in adjacent columns staggered from each other in a direction transverse to the columns; forming a first encapsulation layer comprising inorganic material on the substrate to cover the first projection and the second projection; forming a second encapsulation layer comprising organic material on the first encapsulation layer; receiving excess organic material in at least one of the cavities; and forming a third encapsulation layer comprising inorganic material on the second encapsulation layer and the first projection and the second projection.

The step of forming the second projection may include: forming a body portion in which the cavities are defined at least partially surrounding the display area; and forming protruding portions extending from one side of the body portion facing the display area.

The step of forming the substrate may include: forming an insulating layer in the display area of the substrate that extends to the non-display area; and forming the pixels on the insulating layer in the display area of the substrate, wherein the second projection may be formed between the boundary of the insulating layer and the first projection.

The step of forming the substrate may include: forming an insulating layer in the display area of the substrate that extends to the non-display area; and forming the pixels on the insulating layer in the display area of the substrate, wherein the second projection may be formed between the boundary of the insulating layer and the second encapsulation layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION OF THE EMBODIMENTS

Figure 1:
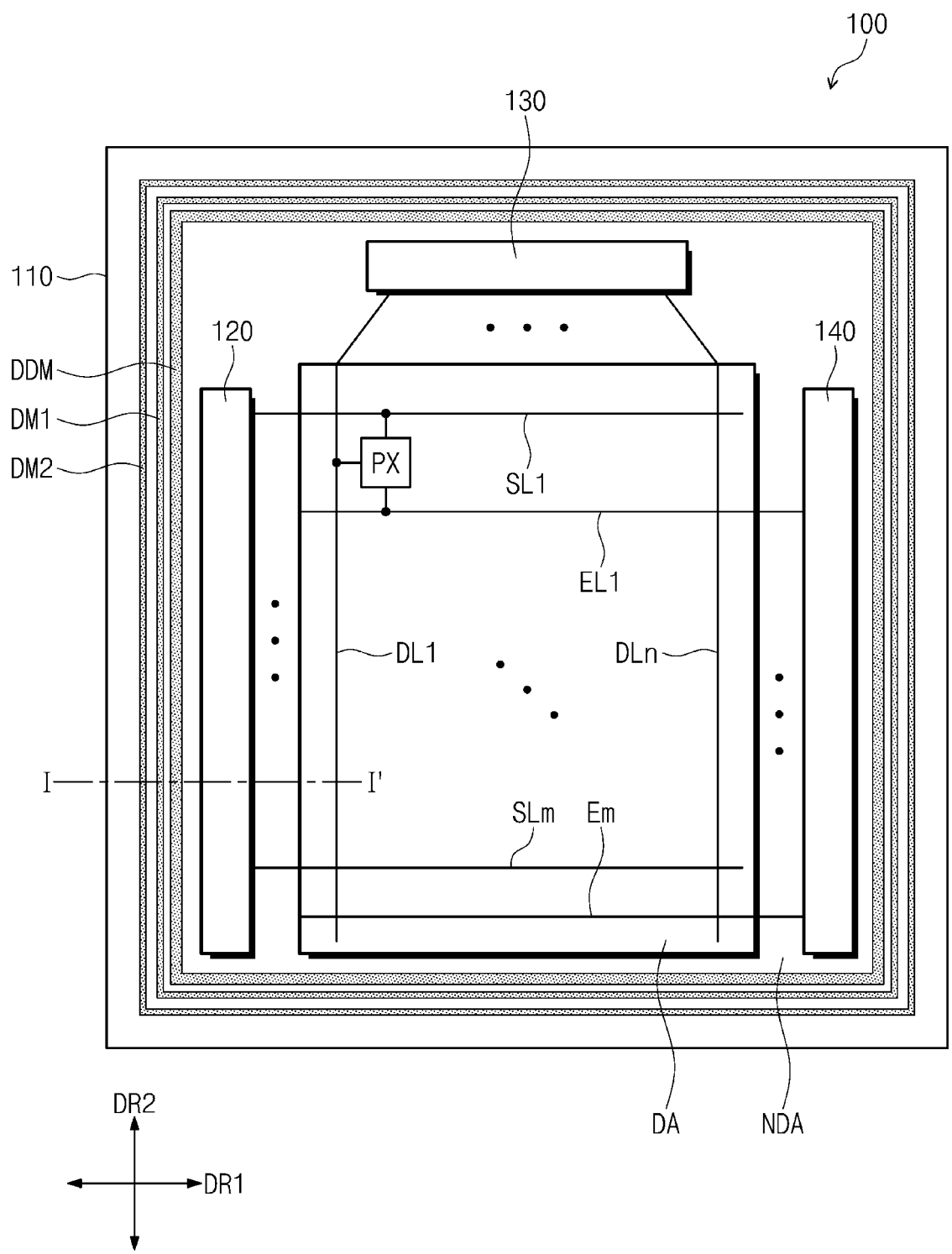
FIG. 1 is a plan view illustrating a display apparatus constructed according to a first exemplary embodiment of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, the principles of the invention will be explained in detail with reference to the accompanying drawings.

FIG. 1 is a plan view illustrating a display apparatus 100 constructed according to a first exemplary embodiment of the invention.

Referring to FIG. 1, the display apparatus 100 according to the illustrated embodiment of the invention may include a display panel 110, a scan driver 120, a data driver 130, an emission driver 140, a plurality of first and second projections, which may take the form of dam members DM1 and DM2, and a dummy dam member DDM, respectively. The display panel 110 may be an organic light emitting display panel, but the exemplary embodiments are not limited thereto or thereby. For example, various display panels, such as a liquid crystal display panel, an electrowetting display panel, and an electrophoretic display panel, etc., may be used as the display panel 110.

The display panel 110 may be a flexible display panel. For example, the display panel 110 may include a substrate formed of a plastic material having flexibility and a plurality of electronic elements disposed on the substrate. The display panel 110 may have a rectangular shape which has short sides parallel to a first direction DR1 and long sides parallel to a second direction DR2 crossing the first direction DR1.

The display panel 110 may have a flat surface (or a planar surface) parallel to the first direction DR1 and the second direction DR2. The flat surface of the display panel 110 may include a display area DA and a non-display area NDA surrounding the display area DA. The display area DA corresponds to an area which an image is display, and the non-display area NDA corresponds to an area which no image is displayed.

The display panel 110 may include a plurality of pixels PX, a plurality of scan lines SL1 to SLm, a plurality of data lines DL1 to DLn, and a plurality of emission lines EL1 to ELm. Each of the "m'" and "n" is a natural number. For the convenience of explanation, FIG. 1 shows one pixel PX, however the display panel 110 substantially includes the plurality of pixels PX arranged thereon. The plurality of pixels PX may be arranged in a matrix form in the display area DA and may be connected to the scan lines SL1 to SLm, the data lines DL1 to DLn, and the emission lines EL1 to ELm.

The scan driver 120, the data driver 130, and the emission driver 140 may be disposed in the non-display area NDA. The scan driver 120 may be disposed in the non-display area NDA adjacent to one side of the display panel 110, which corresponds to one side of the long sides of the display panel 110. The emission driver 140 may be disposed in the non-display area NDA adjacent to another side of the display panel 110, which is opposite to the one side of the display panel 110. The data driver 130 may be implemented in an integrated circuit form and may be disposed in the non-display area NDA adjacent to one side of the short sides of the display panel 110.

The scan lines SL1 to SLm may extend in the first direction DR1 and may be connected to the scan driver 120. The scan lines SL1 to SLm may receive a plurality of scan signals from the scan driver 120. The data lines DL1 to DLn may extend in the second direction DR2 and may be connected to the data driver 130. The data lines DL1 to DLn may receive a plurality of data voltages from the data driver 130. The emission lines EL1 to ELm may extend in the first direction DR1 and may be connected to the emission driver 140. The emission lines EL1 to ELm may receive a plurality of emission signals from the emission driver 140.

The scan driver 120 may generate the scan signals, and the scan signals may be applied to the plurality of pixels PX through the scan lines SL1 to SLm. The scan signals may be applied sequentially to the plurality of pixels PX. The data driver 130 may generate the data voltages, and the data voltages may be applied to the plurality of pixels PX through the data lines DL1 to DLn. The emission driver 140 may generate the emission signals, and the emission signals may be applied to the plurality of pixels PX through the emission lines EL1 to ELm.

The display apparatus 100 may include a timing controller to control operations of the scan driver 120, the data driver 130, and the emission driver 140. The timing controller may generate a scan control signal, a data control signal, and an emission control signal in response to control signals provided from an external source. Additionally, the timing controller may receive image signals from the external source and may convert a data format of the image signals to a data format appropriate to an interface between the data driver 130 and the timing controller. The timing controller may provide the image signals whose data format is converted to the data driver 130.

The scan driver 120 may generate the scan signals in response to the scan control signal, and the emission driver 140 may generate the emission signals in response to the emission control signal. The data driver 130 may receive the image signals having the converted data format and may generate the data voltages corresponding to the image signals in response to the data control signal.

The plurality of pixels PX may receive the data voltages in response to the scan signals. The plurality of pixels PX may emit a light having brightness corresponding to the data voltages in response to the emission signals, and as a result, the image may be displayed. A light emitting time of the plurality of pixels PX may be controlled by the emission signals.

In exemplary embodiments, the scan driver 120, the data driver 130, the emission driver 140, and/or one or more components thereof, may be implemented via one or more general purpose and/or special purpose components, such as one or more discrete circuits, digital signal processing chips, integrated circuits, application specific integrated circuits, microprocessors, processors, programmable arrays, field programmable arrays, instruction set processors, and/or the like.

According to one or more exemplary embodiments, the features, functions, processes, etc., described herein may be implemented via software, hardware (e.g., general processor, digital signal processing (DSP) chip, an application specific integrated circuit (ASIC), field programmable gate arrays (FPGAs), etc.), firmware, or a combination thereof. In this manner, the scan driver 120, the data driver 130, the emission driver 140, and/or one or more components thereof may include or otherwise be associated with one or more memories including code (e.g., instructions) configured to cause the scan driver 120, the data driver 130, the emission driver 140, and/or one or more components thereof to perform one or more of the features, functions, processes, etc., described herein.

The memories may be any medium that participates in providing code to the one or more software, hardware, and/or firmware components for execution. Such memories may be implemented in any suitable form, including, but not limited to, non-volatile media, volatile media, and transmission media. Non-volatile media include, for example, optical or magnetic disks. Volatile media include dynamic memory. Transmission media include coaxial cables, copper wire and fiber optics. Transmission media can also take the form of acoustic, optical, or electromagnetic waves. Common forms of computer-readable media include, for example, a floppy disk, a flexible disk, hard disk, magnetic tape, any other magnetic medium, a compact disk-read only memory (CD-ROM), a rewriteable compact disk (CD-RW), a digital video disk (DVD), a rewriteable DVD (DVD-RW), any other optical medium, punch cards, paper tape, optical mark sheets, any other physical medium with patterns of holes or other optically recognizable indicia, a random-access memory (RAM), a programmable read only memory (PROM), and erasable programmable read only memory (EPROM), a FLASH-EPROM, any other memory chip or cartridge, a carrier wave, or any other medium from which information may be read by, for example, a controller/processor.

The dam members DM1 and DM2 may be disposed in the non-display area NDA to partially or completely surround the display area DA. In detail, the dam members DM1 and DM2 may extend along an edge of the display panel 110 to surround the scan driver 120, the data driver 130, and the emission driver 140. The dummy dam member DDM may be disposed between the dam members DM1 and DM2 and the display area DA. As a representative example, two dam members DM1 and DM2 are described, but the exemplary embodiments are not limited thereto, and the number of the dam members DM1 and DM2 should not be limited to two.

The dam members DM1 and DM2 may include a first dam member DM1 adjacent to the dummy dam member DDM and a second dam member DM2 adjacent to the edge of the display panel 110. The first dam member DM1 may be disposed between the dummy dam member DDM and the second dam member DM2. The first and second dam members DM1 and DM2 and the dummy dam member DDM will be described in more detail below.

Figure 2:
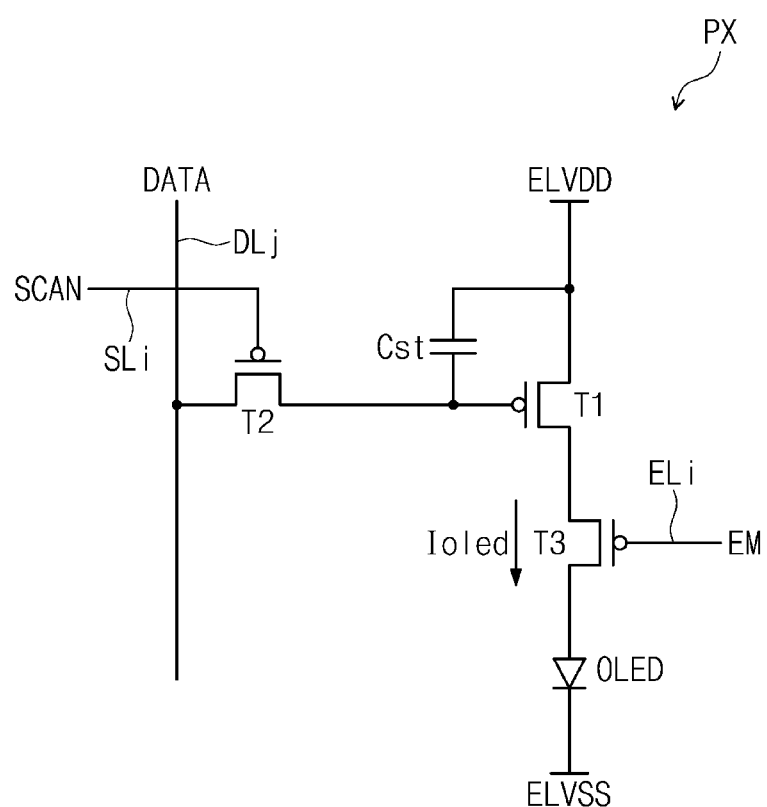
FIG. 2 is an equivalent circuit diagram showing a representative pixel illustrated in FIG. 1.

FIG. 2 is an equivalent circuit diagram showing a representative pixel PX illustrated in FIG. 1.

FIG. 2 illustrates only one representative pixel PX, however, the plurality of pixels PX disposed in the display panel 110 may have substantially the same configuration as that of the pixel PX illustrated in FIG. 2.

Referring to FIG. 2, the pixel PX may be connected to a corresponding scan line SLi of the scan lines SL1 to SLm, a corresponding data line DLj of the data lines DL1 to DLn, and a corresponding emission line ELi of the emission lines EL1 to ELm. The "i" is a natural number equal to or less than the "m", and the "j" is a natural number equal to or less than the "n". The pixel PX may include a light emitting element OLED, a driving transistor T1, a capacitive element Cst, a switching transistor T2, and an emission control transistor T3. The light emitting element OLED may be, but not limited to, an organic light emitting diode.

A source terminal of the driving transistor T1 may be applied with a first voltage ELVDD, and a drain terminal of the driving transistor T1 may be connected to a source terminal of the emission control transistor T3. A gate terminal of the driving transistor T1 may be connected to a drain terminal of the switching transistor T2.

A gate terminal of the switching transistor T2 may be connected to the scan line SLi, and a source terminal of the switching transistor T2 may be connected to the data line DLj. A first electrode of the capacitive element Cst may be connected to the source terminal of the driving transistor T1, and a second electrode of the capacitive element Cst may be connected to the gate terminal of the driving transistor T1.

A gate terminal of the emission control transistor T3 may be connected to the emission line ELi, and a drain terminal of the emission control transistor T3 may be connected to an anode electrode of the light emitting element OLED. A cathode electrode of the light emitting element OLED may be applied with a second voltage ELVSS. The second voltage ELVSS may have a level lower than a level of the first voltage ELVDD.

The switching transistor T2 may be turned on in response to a scan signal SCAN provided through the scan line SLi. The turned-on switching transistor T2 may provide a data voltage DATA, which is provided through the data line DLj, to the gate terminal of the driving transistor T1. The capacitive element Cst may be charged with the data voltage DATA applied to the gate terminal of the driving transistor T1 and may maintain the charged data voltage DATA after the switching transistor T2 is turned off.

The gate terminal of the emission control transistor T3 may receive an emission signal EM through the emission line ELi, and the emission control transistor T3 may be turned on in response to the emission signal EM. The turned-on emission control transistor T3 may provide a driving current $I_{oled}$ flowing through the driving transistor T1 to the light emitting element OLED. The pixel PX may emit a light while the emission signal EM is applied to the emission control transistor T3. An intensity of the light emitted from the light emitting element OLED may be changed depending on the amount of the driving current $I_{oled}$.

In an exemplary embodiment, the transistors T1, T2, and T3 of the pixel PX are PMOS transistors, but the exemplary embodiments are not limited thereto or thereby. That is, the transistors T1, T2, and T3 of the pixel PX may be NMOS transistors.

Figure 3:
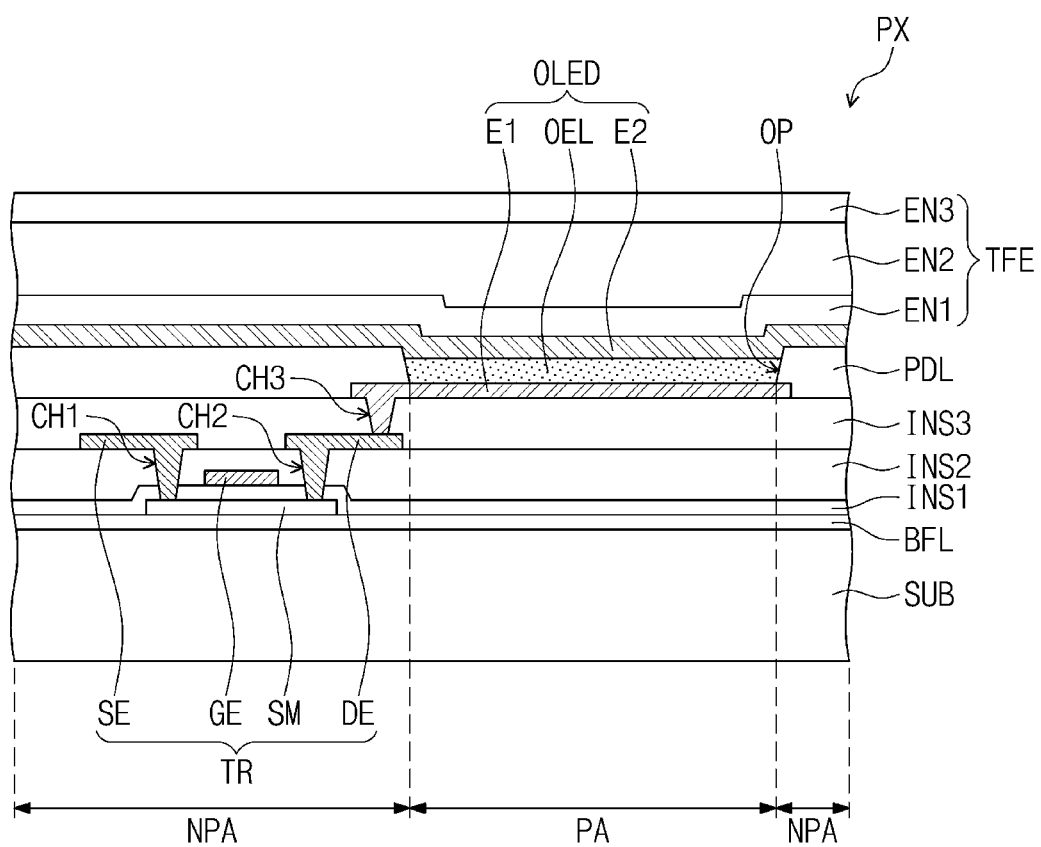
FIG. 3 is a cross-sectional view illustrating the pixel illustrated in FIG. 2.

FIG. 3 is a cross-sectional view illustrating the pixel PX illustrated in FIG. 2.

Referring to FIG. 3, the pixel PX may include a light emitting element OLED and a transistor TR connected to the light emitting element OLED. The transistor TR may be the emission control transistor T3 illustrated in FIG. 2. The transistor TR and the light emitting element OLED may be disposed on a substrate SUB, and the substrate SUB may include a transparent flexible substrate made of a plastic material with flexibility. For example, the substrate SUB may include polyimide (PI).

A buffer layer BFL may be disposed on the substrate SUB and may include an inorganic material. A semiconductor layer SM of the transistor TR may be disposed on the buffer layer BFL. The semiconductor layer SM may include an inorganic semiconductor, such as amorphous silicon or poly-silicon, or may include an organic semiconductor. Alternatively, the semiconductor layer SM may include an oxide semiconductor. Although not shown in FIG. 3, the semiconductor layer SM may include a source region, a drain region, and a channel region between the source region and the drain region.

A first insulating layer INS1 may be disposed on the buffer layer BFL to cover the semiconductor layer SM. The first insulating layer INS1 may include an inorganic material. A gate electrode GE of the transistor TR may be disposed on the first insulating layer INS1 to overlap with the semiconductor layer SM. The gate electrode GE may be disposed to overlap with the channel region of the semiconductor layer SM.

A second insulating layer INS2 may be disposed on the first insulating layer INS1 to cover the gate electrode GE. The second insulating layer INS2 may be referred to as an interlayer insulating layer. The second insulating layer INS2 may include an organic material and/or an inorganic material.

A source electrode SE and a drain electrode DE of the transistor TR may be spaced apart from each other and may be disposed on the second insulating layer INS2. The source electrode SE may be connected to the source region of the semiconductor layer SM through a first contact hole CH1 defined through the first and second insulating layers INS1 and INS2. The drain electrode DE may be connected to the drain region of the semiconductor layer SM through a second contact hole CH2 defined through the first and second insulating layers INS1 and INS2.

A third insulating layer INS3 may be disposed on the second insulating layer INS2 to cover the source electrode SE and the drain electrode DE of the transistor TR. The third insulating layer INS3 may be referred to as a planarization layer to provide a flat top surface. The third insulating layer INS3 may include an organic material.

A first electrode E1 of the light emitting element OLED may be disposed on the third insulating layer INS3. The first electrode E1 may be connected to the drain electrode DE of the transistor TR through a third contact hole CH3 defined through the third insulating layer INS3. The first electrode E1 may be referred to as a pixel electrode or an anode electrode. The first electrode E1 may include a transparent electrode or a reflective electrode.

A pixel defining layer PDL may be disposed on the first electrode E1 and the third insulating layer INS3 to expose a predetermined portion of the first electrode E1. An opening portion OP may be defined through the pixel defining layer PDL to expose the predetermined portion of the first electrode E1. An area in which the opening portion OP is defined may be referred to as a pixel area PA. A periphery of the pixel area PA may be referred to as a non-pixel area NPA.

An organic light emitting layer OEL may be disposed on the first electrode E1 in the opening portion OP. The organic light emitting layer OEL may include an organic material capable of generating a light having one of a red color, a green color, and a blue color. Therefore, the organic light emitting layer OEL may generate one of red, green, and blue lights, however the exemplary embodiments are not be limited thereto or thereby. That is, the organic light emitting layer OEL may generate a white light by a combination of organic materials respectively generating red light, green light, and blue light.

The organic light emitting layer OEL may include a low-molecular organic material or a high-molecular organic material. Although not shown in FIG. 3, the organic light emitting layer OEL may be formed of a multi-layer structure of a hole injection layer (HIL), a hole transporting layer (HTL), a light emitting layer (EML), an electron transporting layer (ETL), and an electron injection layer (EIL). The hole injection layer may be disposed on the first electrode E1. The hole transporting layer, the light emitting layer, the electron transporting layer, and the electron injection layer may be sequentially stacked on the hole injection layer.

A second electrode E2 of the light emitting element OLED may be disposed on the pixel defining layer PDL and the organic light emitting layer OEL. The second electrode E2 may be referred to as a common electrode or a cathode electrode. The second electrode E2 may include a transparent electrode or a reflective electrode.

When the display panel 110 is a front emission type organic light emitting display panel, the first electrode E1 may be the reflective electrode, and the second electrode E2 may be the transparent electrode. When the display panel 110 is a rear emission type organic light emitting display panel, the first electrode E1 may be the transparent electrode, and the second electrode E2 may be the reflective electrode.

The light emitting element OLED may be disposed in the pixel area PA and may include the first electrode E1, the organic light emitting layer OEL, and the second electrode E2 in the pixel area PA. The first electrode E1 may be an anode configured to inject holes, and the second electrode E2 may be a cathode configured to inject electrons.

A thin film encapsulation layer TFE may be disposed on the light emitting element OLED to cover the pixel PX. The thin film encapsulation layer TFE may be disposed on the second electrode E2. The thin film encapsulation layer TFE may include a first encapsulation layer EN1 disposed on the light emitting element OLED, a second encapsulation layer EN2 disposed on the first encapsulation layer EN1, and a third encapsulation layer EN3 disposed on the second encapsulation layer EN2. Each of the first and third encapsulation layers EN1 and EN3 may include an inorganic material, and the second encapsulation layer EN2 may include an organic material. The second encapsulation layer EN2 may have a thickness greater than a thickness of each of the first and third encapsulation layers EN1 and EN3.

The first voltage ELVDD may be applied to the first electrode E1 through the transistor TR, and the second voltage ELVSS may be applied to the second electrode E2. Holes and electrons injected in the organic light emitting layer OEL may be combined with each other to generate excitons (electron-hole pairs), and the excitons may transit from an excited state to a ground state to emit light from the light emitting element OLED. The light emitting element OLED may emit one of red light, green light, and blue light having an intensity depending on a driving current, and thus image information may be displayed.

Figure 4:
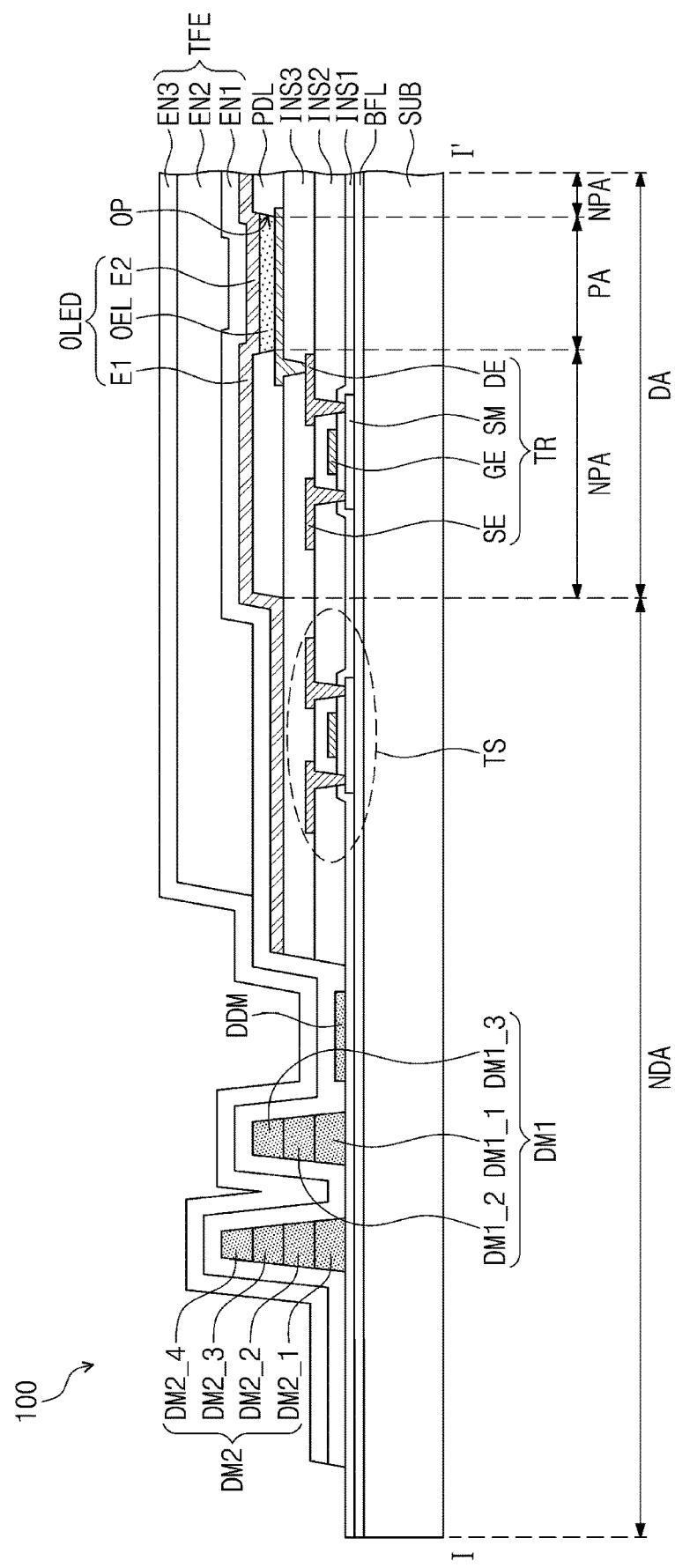
FIG. 4 is a cross-sectional view taken along a line I-I' illustrated in FIG. 1.
Figure 5:
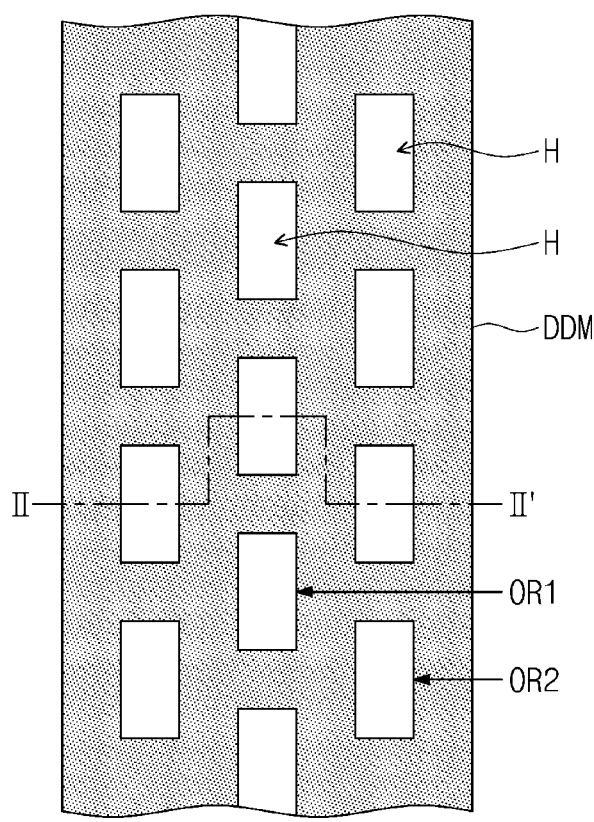
FIG. 5 is a plan view illustrating a portion of a dummy dam member shown in FIG. 4.
Figure 6:
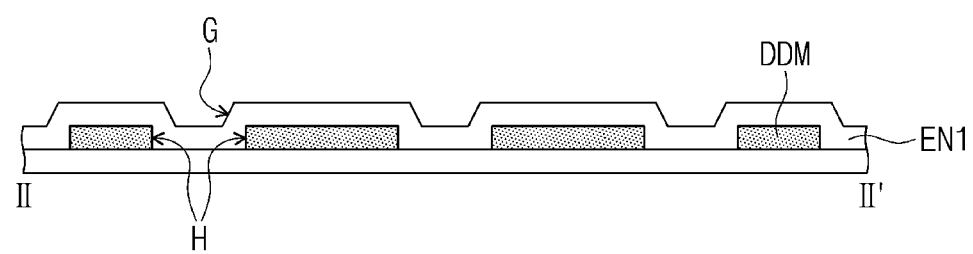
FIG. 6 is a cross-sectional view taken along a line II-IF illustrated in FIG. 5.

FIG. 4 is a cross-sectional view taken along a line I-I' illustrated in FIG. 1. FIG. 5 is a plan view illustrating a portion of the dummy dam member DDM illustrated in FIG. 4. FIG. 6 is a cross-sectional view taken along a line II-IF illustrated in FIG. 5.

Referring to FIG. 4, FIG. 5, and FIG. 6, the substrate SUB may include the display area DA and the non-display area NDA, and the display area DA of the substrate SUB may include the pixel area PA and the non-pixel area NPA. The pixel PX may be disposed in the display area DA of the substrate SUB. The first and second dam members DM1 and DM2 and the dummy dam member DDM may be disposed in the non-display area NDA of the substrate SUB.

The scan driver 120 may include a plurality of transistors, and the transistors of the scan driver 120 may be disposed on the substrate SUB. For the convenience of explanation, FIG. 4 shows one transistor TS of the scan driver 120 as an exemplary embodiment. Also, in the cross-sectional view of FIG. 4, a portion where the scan driver 120 is disposed is illustrated in a relatively reduced size.

The buffer layer BFL and the first insulating layer INS1 may be disposed in the display area DA and the non-display area NDA of the substrate SUB. The second insulating layer INS2 may be disposed in the display area DA of the substrate SUB. The second insulating layer INS2 may extend to a portion of the non-display area NDA adjacent to the dummy dam member DDM, and the second insulating layer INS2 may be disposed adjacent to the dummy dam member DDM.

The third insulating layer INS3 disposed in the display area DA of the substrate SUB may extend to the portion of the non-display area NDA adjacent to the dummy dam member DDM, and the third insulating layer INS3 may be disposed adjacent to the dummy dam member DDM and may be disposed on the second insulating layer INS2 in the portion of the non-display area NDA. The third insulating layer INS3 may be disposed on the transistors TR and TS to cover the transistor TR in the display area DA and the transistor TS in the non-display area NDA. The light emitting element OLED may be disposed on the third insulating layer INS3. The second electrode E2 of the light emitting element OLED may extend to the non-display area NDA and may be disposed on the third insulating layer INS3 in the non-display area NDA.

The first and second dam members DM1 and DM2 may be disposed in the non-display area NDA of the substrate SUB and may extend along the edge of the substrate SUB. The dummy dam member DDM may be disposed on the substrate SUB between the first and second dam members DM1 and DM2 and the display area DA. As shown in FIG. 5, cavities that may be in the form of recesses, openings, holes of other type of discontinuity in the surface of the dummy dam member that may receive or direct organic material flowing from another layer during manufacture as described in more detail herein. For ease of description, the cavities in the illustrated embodiment are shown as holes H that may be defined through the dummy dam member DDM. The holes H may be arranged in a plurality of columns. The holes H arranged in an h-th column of the columns may be alternately arranged with the holes H arranged in an (h+1)-th column (adjacent column) of the columns. In this manner, the holes H arranged in the h-th column are staggered from so as not to be arranged parallel to the holes H arranged in the (h+1)-th column in the transverse (row) direction direction, where "h" is a natural number.

The dummy dam member DDM may be disposed on the substrate SUB as a single layer. The dummy dam member DDM may include an organic material. For example, a photoresist including the organic material may be disposed on the substrate SUB to form the dummy dam member DDM, and then, predetermined portions of the photoresist may be removed to define the holes H.

The first dam member DM1 may have a height higher than a height of the dummy dam member DDM, and the second dam member DM2 may have a height higher than the height of the first dam member DM1. A space between the first dam member DM1 and the second dam member DM2 may be defined as a groove. The second dam member DM2 may be disposed adjacent to the edge of the substrate SUB, and the first dam member DM1 may be disposed between the dummy dam member DDM and the second dam member DM2. The height of each of the first and second dam members DM1 and DM2 and the dummy dam member DDM may be defined by a distance between a bottom surface and a top surface of each of the first and second dam members DM1 and DM2 and the dummy dam member DDM.

The dummy dam member DDM may have a width larger than a width of each of the first and second dam members DM1 and DM2. The width of each of the first and second dam members DM1 and DM2 and the dummy dam member DDM may be defined by a distance between one side and the other side of each of the first and second dam members DM1 and DM2 and the dummy dam member DDM. The dummy dam member DDM may have a thickness in a range of about 2 micrometers (μm) to about 5 micrometers (μm). The dummy dam member DDM may have a width greater than or equal to about 10 micrometers (μm). Of course other dimensions may be used depending upon the particular application.

The first dam member DM1 may include a first dam insulating layer DM1_1 disposed on the substrate SUB, a second dam insulating layer DM1_2 disposed on the first dam insulating layer DM1_1, and a third dam insulating layer DM1_3 disposed on the second dam insulating layer DM1_2. The second dam member DM2 may include a fourth dam insulating layer DM2_1 disposed on the substrate SUB, a fifth dam insulating layer DM2_2 disposed on the fourth dam insulating layer DM2_1, a sixth dam insulating layer DM2_3 disposed on the fifth dam insulating layer DM2_2, and a seventh dam insulating layer DM2_4 disposed on the sixth dam insulating layer DM2_3.

The first, second, third, fourth, fifth, sixth, and seventh dam insulating layers DM1_1, DM1_2, DM1_3, DM2_1, DM2_2, DM2_3, and DM2_4 may include an organic material. The first, second, third, fourth, fifth, and sixth dam insulating layers DM1_1, DM1_2, DM1_3, DM2_1, DM2_2, and DM2_3 may include the same material as at least one of the second insulating layer INS2, the third insulating INS3, and the pixel defining layer PDL. The seventh dam insulating layer DM2_4 may include an organic material different from the second insulating layer INS2, the third insulating INS3, and the pixel defining layer PDL. However, the exemplary embodiments are not limited thereto or thereby. That is, the seventh dam insulating layer DM2_4 may include the same organic material as at least one of the second insulating layer INS2, the third insulating INS3, and the pixel defining layer PDL.

The first encapsulation layer EN1 may be disposed on the substrate SUB to cover the light emitting element OLED, the third insulating layer INS3, the dummy dam member DDM, and the first and second dam members DM1 and DM2. When the first encapsulation layer EN1 is disposed on the dummy dam member DDM, since the first encapsulation layer EN1 is disposed at a lower position in portions in which the holes H of the dummy dam member DDM are defined as shown in FIG. 6, grooves G may be defined in the first encapsulation layer EN1.

The second encapsulation layer EN2 may be disposed on the first encapsulation layer EN1 in the display area DA and may extend to the non-display area NDA. The second encapsulation layer EN2 may be disposed on a predetermined portion of the third insulating layer INS3 adjacent to a boundary of the third insulating layer INS3 in the non-display area NDA. The third encapsulation layer EN3 may be disposed on the first encapsulation layer EN1 to cover the second encapsulation layer EN2. The dummy dam member DDM may be disposed between boundaries of the second and third insulating layers INS2 and INS3 and the first dam member DM1. The height of the dummy dam member DDM may be lower than a height of a top surface of the second insulating layer INS2.

When the thin film encapsulation layer TFE of the display apparatus 100 is manufactured, a liquid organic material may be provided on the first encapsulation layer EN1 to form the second encapsulation layer EN2. If excessive amounts of the liquid organic material are provided on the first encapsulation layer EN1, the organic material may overflow the substrate SUB and cause problems in reliability and/or require additional processing steps to remove the excess material.

According to the principles and exemplary embodiments of the invention, when the liquid organic material is excessively provided, the excess organic material may be accommodated or contained in the holes H of the dummy dam member DDM. Substantially, the excess organic material may be accommodated or contained in the grooves G of the first encapsulation layer EN1 defined by the holes H. Additionally, the excess organic material may be accommodated or contained in the groove between the first dam member DM1 and the second dam member DM2, thereby reducing or preventing irregularities or defects in other components or layers in the display and/or obviating additional processing steps to remove the excess material.

Referring to FIG. 5, the first organic material OR1 flowing between rows of holes H arranged in a first column may be accommodated or contained in holes H arranged in a second column (or a middle column), and the second organic material OR2 flowing toward the holes H arranged in a first column may be accommodated or contained in the holes H arranged in the first column. When the holes H arranged in the second column are arranged in the same rows as the holes H arranged in the first column and holes H arranged in a third column, the first organic material OR1 flowing between the rows of holes H may not be accommodated or contained in the holes H and pass through between the rows of the holes H. Thus, a staggered arrangement of holes is advantageous.

In the illustrated embodiment, since the holes H arranged in the second column are alternately arranged so as to be staggered with the holes H arranged in the first column and the holes H arranged in the third column, the first organic material OR1 may be accommodated or contained in the holes H arranged in the second column. That is, a flow of the first organic material OR1 may be effectively blocked or contained. Therefore, the excess organic material may be effectively accommodated or contained in the holes H in the dummy dam member DDM.

Consequently, the display apparatus 100 according to the illustrated embodiment may effectively block the excess organic material by using the first and second dam members DM1 and DM2 disposed adjacent to the edge of the display panel 110 and the dummy dam member DDM through which the holes H are defined.

FIGS. 7, 8, 9, and 10 are plan views illustrating various exemplary embodiments of dummy dam members that may be used in the display apparatus 100 constructed according to exemplary embodiments of the invention.

Hereinafter, structures of dummy dam members DDMP, DDMP1, DDMP2, and DDMP3 different from that of the dummy dam member DDM shown in FIGS. 4 and 5 will be mainly described with reference to FIGS. 7, 8, 9, and 10. In FIGS. 7, 8, 9, and 10, the same reference numerals denote the same elements as those in FIGS. 4 and 5.

Figure 7:
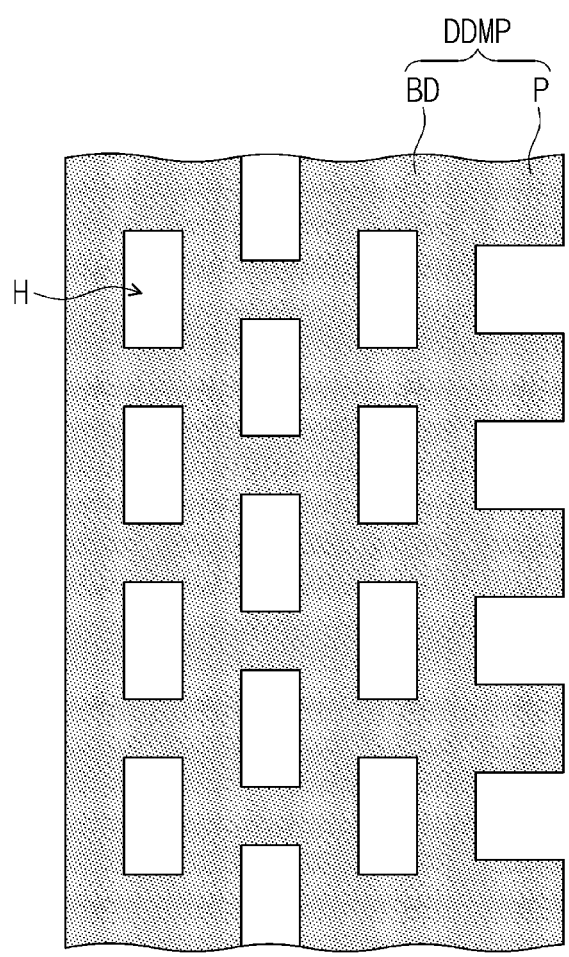
FIGS. 7, 8, 9, and 10 are plan views illustrating various exemplary embodiments of dummy dam members that may be used in the display apparatus constructed according to exemplary embodiments of the invention.

Referring to FIG. 7, the dummy dam member DDMP may include a body portion BD and protruding portions P extending from the body portion BD. The body portion BD may surround the display area DA, holes H may be defined through the body portion BD, and the holes H shown in FIG. 7 may be substantially the same as the holes H shown in FIG. 5. The body portion BD may have substantially the same structure as the dummy dam member DDM shown in FIG. 5. The protruding portions P may extend from one side of the body portion BD toward the display area DA, and each of the protruding portions P may have a rectangular shape. The protruding portions P may be alternately arranged so as to be staggered in a transverse (row) direction with respect to holes H arranged in a column adjacent to the protruding portions P.

Referring back to FIG. 5, one side of the dummy dam member DDM, which does not include the protruding portions P, may have a substantially flat shape. The one side of the dummy dam member DDM may face the display area DA. However, referring to FIG. 7, when the protruding portions P are disposed at the one side of the body portion BD, a surface area of the side of the dummy dam member DDMP facing the display area DA may increase due to the protruding portions P disposed on the one side of the dummy dam member DDMP. In this case, since an amount of the excess organic material contacting the one side of the dummy dam member DDMP may increase, the excess organic material may be blocked more effectively.

Figure 8:
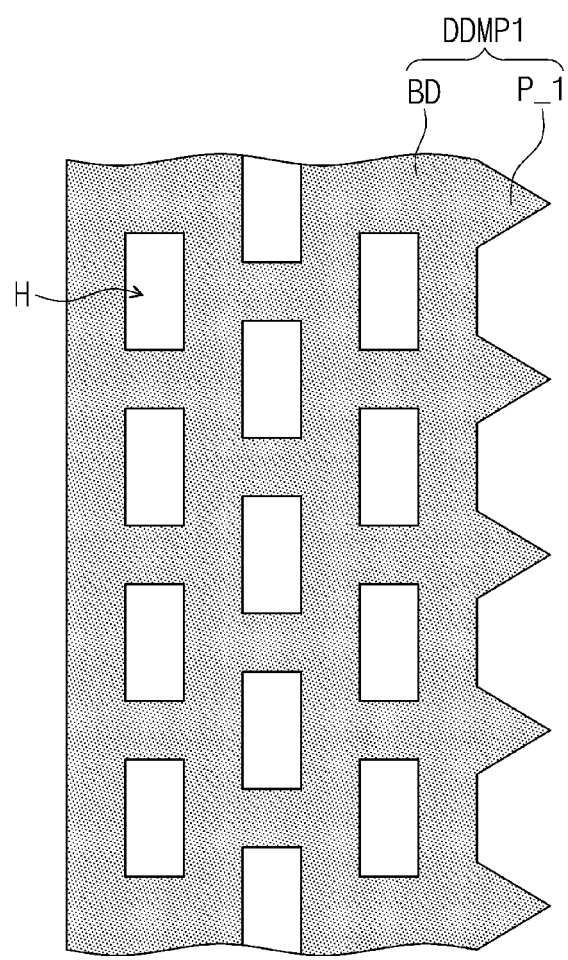

Referring to FIG. 8, the dummy dam member DDMP1 may include a body portion BD and protruding portions P_1 extending from one side of the body portion BD, and each of the protruding portions P_1 may have a triangular shape. Other structures of the dummy dam member DDMP1 are substantially the same as those of the dummy dam member DDMP shown in FIG. 7.

Figure 9:
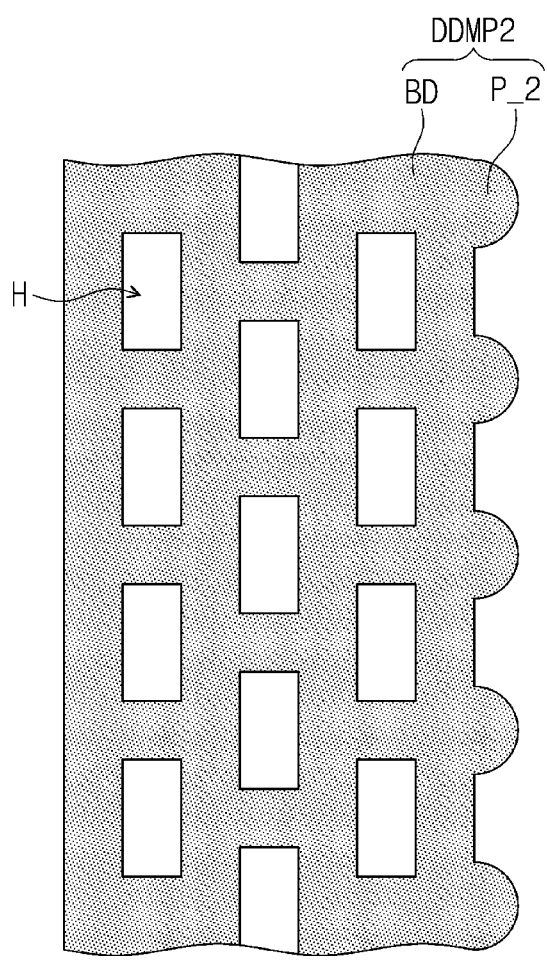

Referring to FIG. 9, the dummy dam member DDMP2 may include a body portion BD and a protruding portions P_2 extending from one side of the body portion BD, and each of the protruding portions P_2 may have a semicircular shape. Other structures of the dummy dam member DDMP2 are substantially the same as those of the dummy dam member DDMP shown in FIG. 7.

Figure 10:
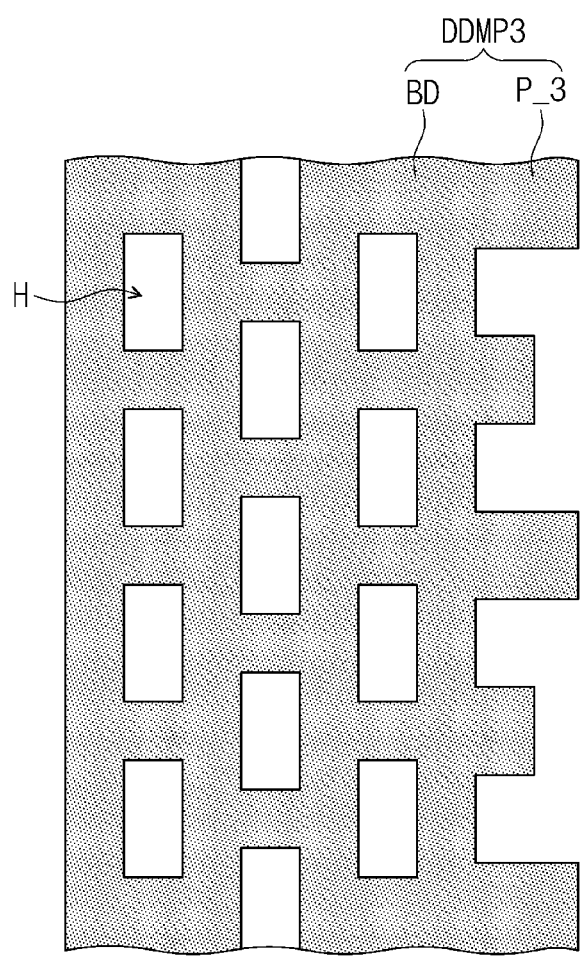

Referring to FIG. 10, the dummy dam member DDMP3 may include a body portion BD and a protruding portions P_3 extending from one side of the body portion BD, and each of the protruding portions P_3 may have a rectangular shape. Two protruding portions P_3, which are adjacent to each other, of the protruding portions P_3 may have extend different amounts to have different sizes from each other. Other structures of the dummy dam member DDMP3 are substantially the same as those of the dummy dam member DDMP shown in FIG. 7.

Figure 11:
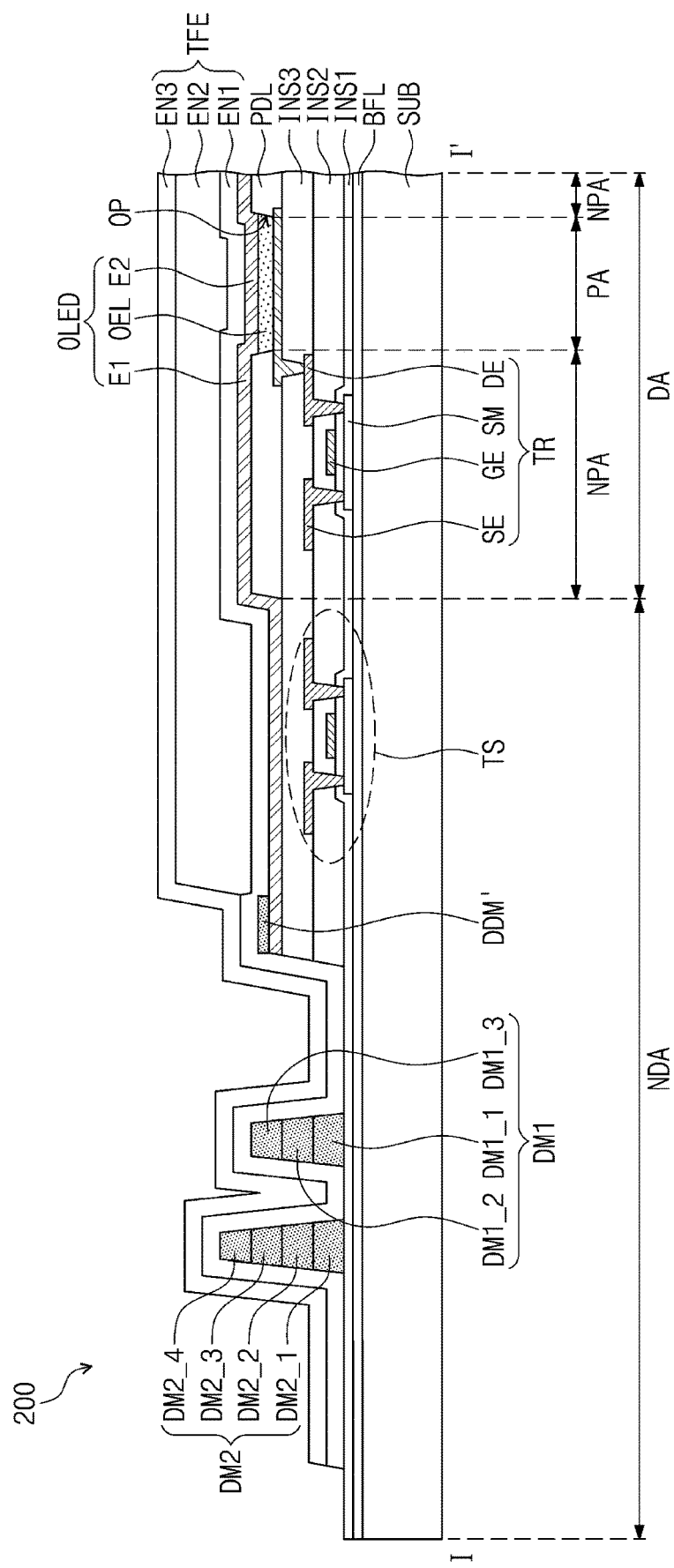
FIG. 11 is a cross-sectional view illustrating a display apparatus constructed according to a second exemplary embodiment of the invention.

FIG. 11 is a cross-sectional view illustrating a display apparatus 200 constructed according to a second exemplary embodiment of the invention.

For the convenience of explanation, FIG. 11 shows a cross-sectional view corresponding to the cross-sectional view shown in FIG. 4. The display apparatus 200 according to the second exemplary embodiment may have substantially the same cross-sectional configuration as that of the display apparatus 100 shown in FIG. 4 except for an arrangement of a dummy dam member DDM'. Accordingly, the arrangement of the dummy dam member DDM' of the display apparatus 200 will be mainly described, and descriptions of the other configurations of the display apparatus 200 that are substantially the same as the display apparatus 100 shown in FIG. 4 will be omitted to avoid redundancy. Additionally, in FIG. 11, the same reference numerals denote the same elements as those in FIG. 4.

Referring to FIG. 11, unlike the dummy dam member DDM shown in FIG. 4, the dummy dam member DDM' may be disposed on the third insulating layer INS3 between the boundary of the third insulating layer INS3 and a boundary of the second encapsulation layer EN2. Therefore, the dummy dam member DDM' may be disposed on the second electrode E2 of the non-display area NDA.

The dummy dam member DDM' may have a size smaller than that of the dummy dam member DDM shown in FIG. 4, but may have substantially the same structure as that of the dummy dam member DDM. For example, the plurality of holes H may also be defined through the dummy dam member DDM' substantially the same as the dummy dam member DDM shown in FIG. 5. Additionally, the dummy dam member DDM' may also include the protruding portions P, P_1, P_2, and P_3 having a rectangular shape, a triangular shape, a semicircular shape, or a rectangular shape of different sizes substantially the same as the dummy dam members DDMP, DDMP1, DDMP2, and DDMP3 shown in FIGS. 7, 8, 9, and 10. The dummy dam member DDM' may have a thickness in a range of about 2 micrometers (μm) to about 5 micrometers (μm). The dummy dam member DDM' may have a width greater than or equal to about 10 micrometers (μm). Of course other dimensions may be used depending upon the particular application.

Figure 12:
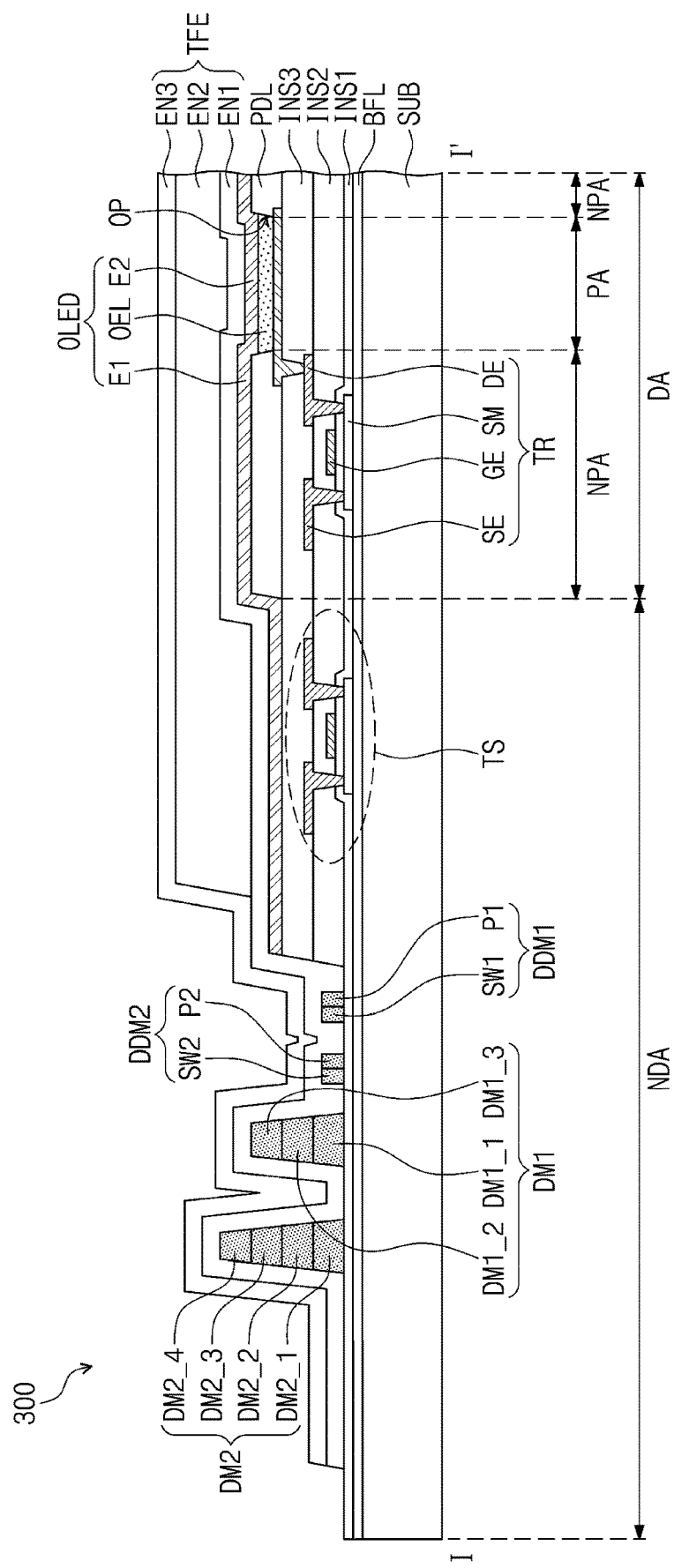
FIG. 12 is a cross-sectional view illustrating a display apparatus constructed according to a third exemplary embodiment of the invention.
Figure 13:
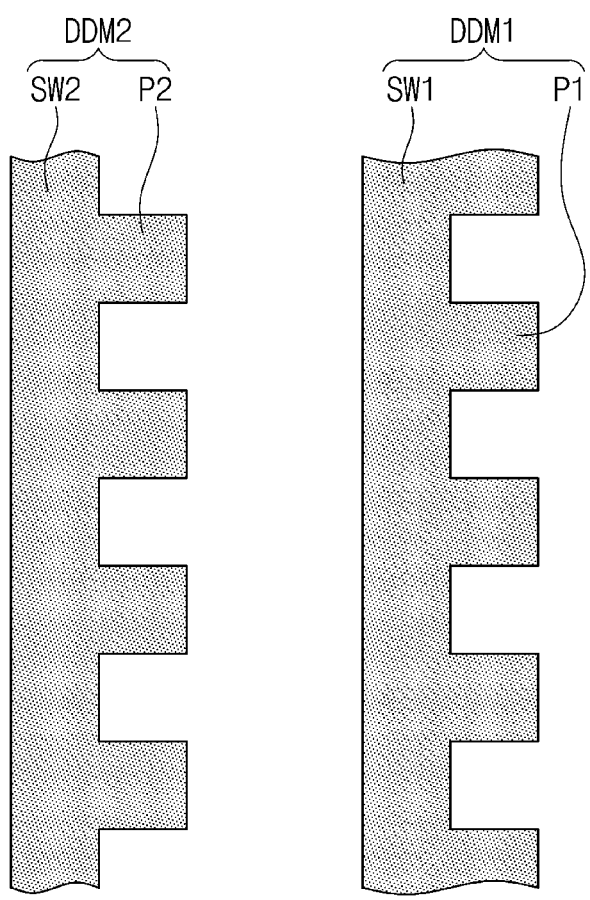
FIG. 13 is a plan view showing a portion of the dummy dam members illustrated in FIG. 12.

FIG. 12 is a cross-sectional view illustrating a display apparatus 300 constructed according to a third exemplary embodiment of the invention. FIG. 13 is a plan view showing a portion of the dummy dam members DDM1 and DDM2 illustrated in FIG. 12.

For the convenience of explanation, FIG. 12 shows a cross-sectional view corresponding to the cross-sectional view shown in FIG. 4. The display apparatus 300 according to the third exemplary embodiment may have substantially the same configuration as that of the display apparatus 100 shown in FIG. 4 except for the dummy dam members DDM1 and DDM2. Accordingly, the dummy dam members DDM1 and DDM2 will be mainly described, and descriptions of the other configurations of the display apparatus 300 that are substantially the same as the display apparatus 100 shown in FIG. 4 will be omitted to avoid redundancy. Additionally, in FIG. 12, the same reference numerals denote the same elements as those in FIG. 4.

Referring to FIG. 12 and FIG. 13, the display apparatus 300 may include dummy dam members DDM1 and DDM2, and the dummy dam members DDM1 and DDM2 may be disposed on the substrate SUB between the first dam member DM1 and the display area DA. Each of the dummy dam members DDM1 and DDM2 may have a height lower than a height of the first dam member DM1.

The dummy dam members DDM1 and DDM2 may include a first dummy dam member DDM1 disposed adjacent to boundaries of the second and third insulating layers INS2 and INS3 and a second dummy dam member DDM2 disposed between the first dummy dam member DDM1 and the dam members DM1 and DM2. The first and second dummy dam members DDM1 and DDM2 may be disposed between the boundaries of the second and third insulating layers INS2 and INS3 and the first dam member DM1. The first and second dummy dam members DDM1 and DDM2 may include side wall portions SW1 and SW2 extending to partially or completely surround the display area DA and protruding portions P1 and P2 extending from one sides of the side wall portions SW1 and SW2.

The first dummy dam member DDM1 may include a first side wall portion SW1 and a plurality of first protruding portions P1 extending from one side of the first side wall portion SW1 toward the display area DA. The second dummy dam member DDM2 may include a second side wall portion SW2 and a plurality of second protruding portions P2 extending from one side of the second side wall portion SW2 toward the display area DA. The first protruding portions P1 may be alternately arranged so as to be staggered with the second protruding portions P2, and each of the first and second protruding portions P1 and P2 may have a rectangular shape.

Each of the first and second dummy dam members DDM1 and DDM2 may have a thickness in a range of about 2 micrometers (μm) to about 5 micrometers (μm). Each of the first and second dummy dam members DDM1 and DDM2 may have a width greater than or equal to about 10 micrometers (μm). Of course other dimensions may be used depending upon the particular application. The thickness of each of the first and second dummy dam members DDM1 and DDM2 may be defined by a distance between a bottom surface and a top surface of each of the first and second dummy dam members DDM1 and DDM2. The width of each of the first and second dummy dam members DDM1 and DDM2 may be defined by a distance between one side surface and the other side surface of each of the first and second dummy dam members DDM1 and DDM2.

Excess organic material may be firstly blocked by the first and second dummy dam members DDM1 and DDM2 and may be secondly blocked by the first and second dam members DM1 and DM2. Since the first and second dummy dam members DDM1 and DDM2 include the first and second protruding portions P1 and P2, a surface area of the one side of each of the first and second dummy dam members DDM1 and DDM2 facing the display area DA may increase, and as a result, the excess organic material may be blocked more effectively. Additionally, since the first and second protruding portions P1 and P2 are alternately arranged with each other, the flow of the organic material may be suppressed more effectively than when the first and second protruding portions P1 and P2 are disposed parallel to each other in a straight line relationship.

Consequently, the display apparatus 300 according to the illustrated embodiment may effectively block excess organic material by using the first and second dam members DM1 and DM2 and the first and second dummy dam members DDM1 and DDM2.

Figure 14:
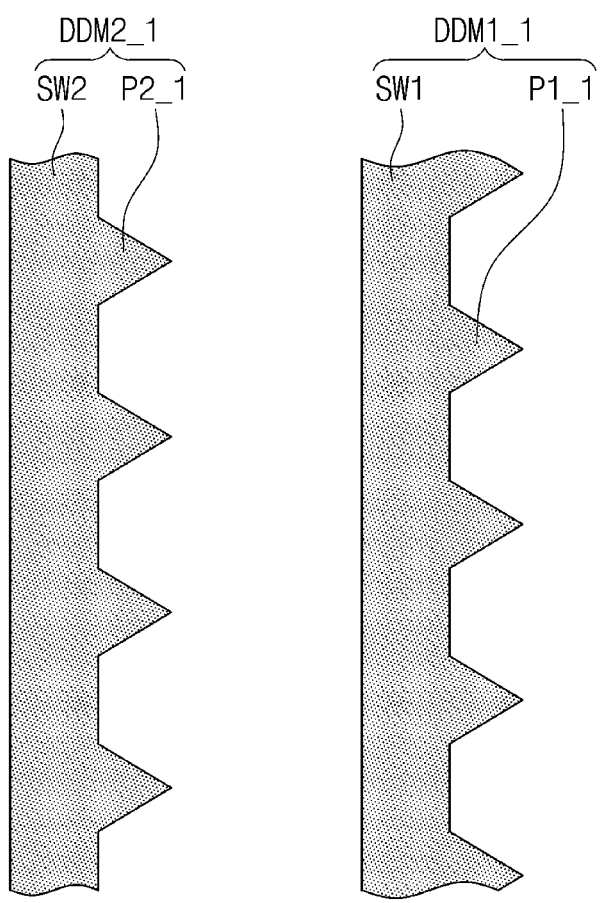
FIGS. 14, 15, and 16 are plan views illustrating various exemplary embodiments of the dummy dam member that may be used in the display apparatus constructed according to exemplary embodiments of the invention.
Figure 15:
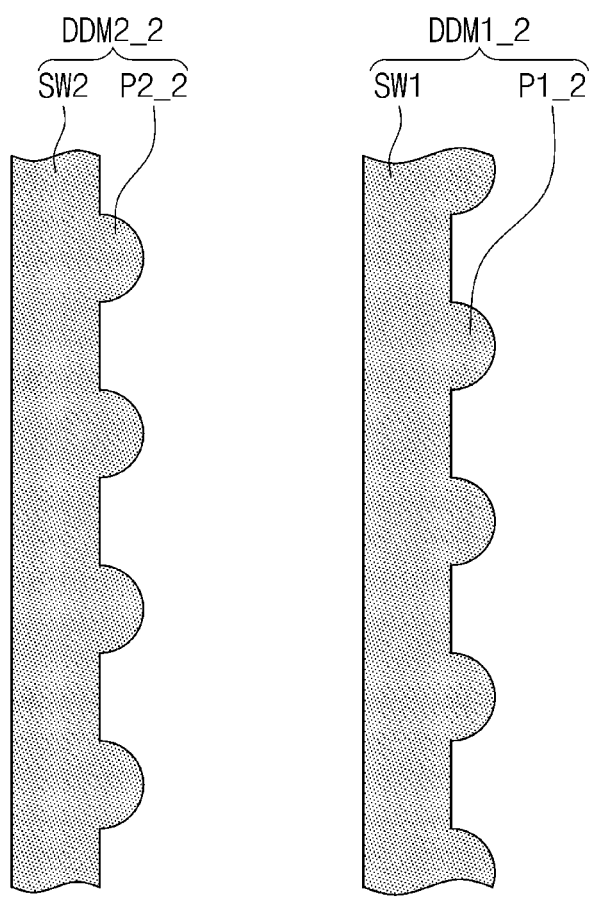
Figure 16:
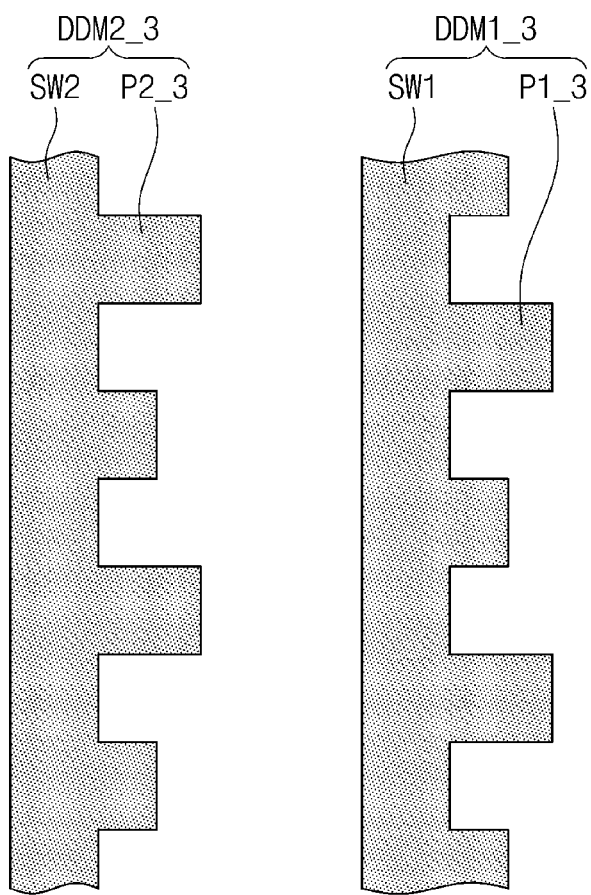

FIGS. 14, 15, and 16 are plan views illustrating various exemplary embodiments of the dummy dam member that may be used in the display apparatus 300 constructed according to exemplary embodiments of the invention.

Hereinafter, structures of first and second dummy dam members DDM1_1, DDM2_1, DDM1_2, DDM2_2, DDM1_3, and DDM2_3 different from those of the first and second dummy dam members DDM1 and DDM2 shown in FIG. 13 will be mainly described with reference to FIGS. 14, 15, and 16. In FIGS. 14, 15, and 16, the same reference numerals denote the same elements as those in FIG. 13.

Referring to FIG. 14, the first dummy dam member DDM1_1 may include a first side wall portion SW1 and first protruding portions P1_1 extending from one side of the first side wall portion SW1. The second dummy dam member DDM2_1 may include a second side wall portion SW2 and second protruding portions P2_1 extending from one side of the second side wall portion SW2. The first and second protruding portions P1_1 and P2_1 may have a triangular shape.

Referring to FIG. 15, the first dummy dam member DDM1_2 may include a first side wall portion SW1 and first protruding portions P1_2 extending from one side of the first side wall portion SW1. The second dummy dam member DDM2_2 may include a second side wall portion SW2 and second protruding portions P2_2 extending from one side of the second side wall portion SW2. The first and second protruding portions P1_2 and P2_2 may have a semicircular shape.

Referring to FIG. 16, the first dummy dam member DDM1_3 may include a first side wall portion SW1 and first protruding portions P1_3 extending from one side of the first side wall portion SW1. The second dummy dam member DDM2_3 may include a second side wall portion SW2 and second protruding portions P2_3 extending from one side of the second side wall portion SW2. The first and second protruding portions P1_3 and P2_3 may have a rectangular shape. The first protruding portions P1_3, which are adjacent to each other, of the first protruding portions P1_3 may have different sizes from each other. The second protruding portions P2_3, which are adjacent to each other, of the second protruding portions P2_3 may have different sizes from each other.

Figure 17:
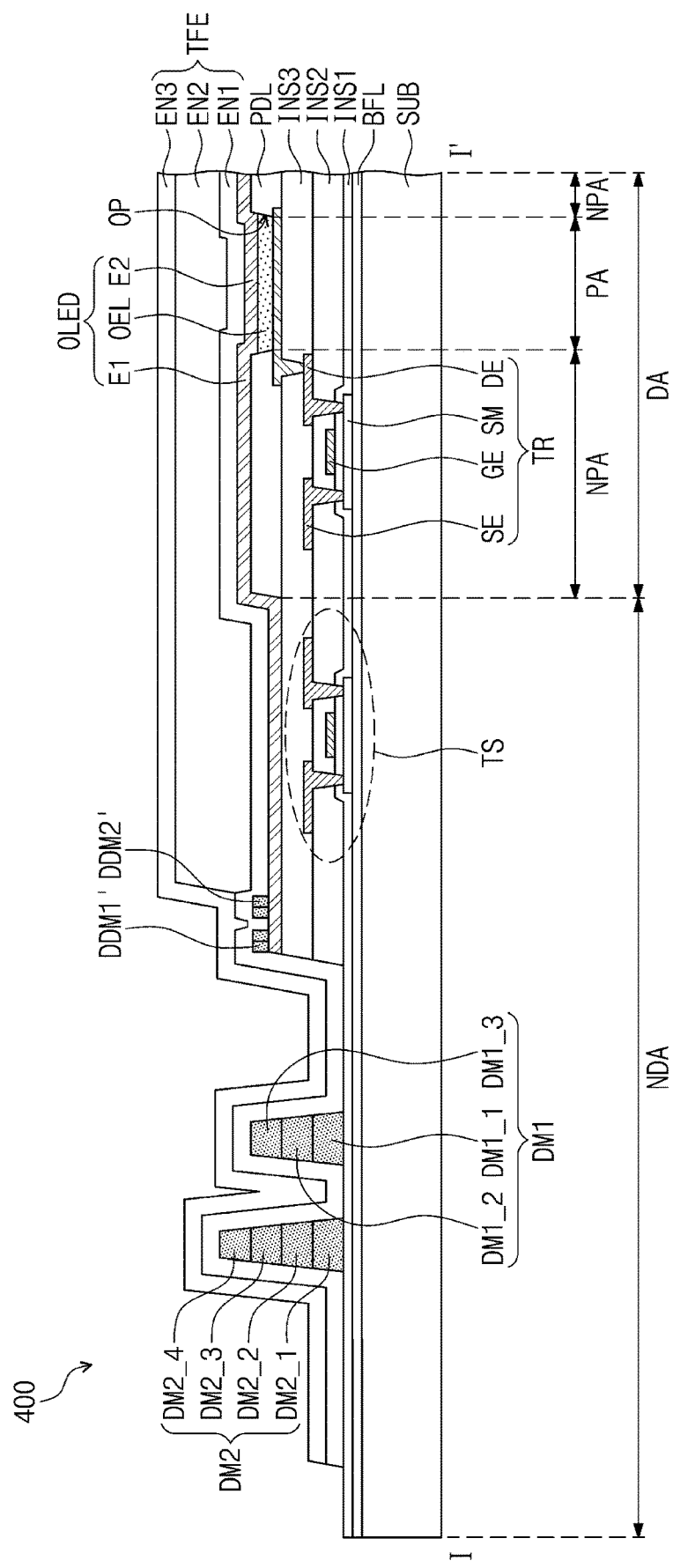
FIG. 17 is a cross-sectional view illustrating a display apparatus constructed according to a fourth exemplary embodiment of the invention.

FIG. 17 is a cross-sectional view illustrating a display apparatus 400 constructed according to a fourth exemplary embodiment of the invention.

For the convenience of explanation, FIG. 17 shows a cross-sectional view corresponding to the cross-sectional view shown in FIG. 4. The display apparatus 400 according to the fourth exemplary embodiment may have substantially the same configuration as that of the display apparatus 300 shown in FIG. 12 except for arrangements of dummy dam members DDM1' and DDM2'. Accordingly, the arrangements of the dummy dam members DDM1' and DDM2' of the display apparatus 400 will be mainly described, and descriptions of the other configurations of the display apparatus 400 that are substantially the same as the display apparatus 300 shown in FIG. 12 will be omitted to avoid redundancy. Additionally, in FIG. 17, the same reference numerals denote the same elements as those in FIG. 4.

Referring to FIG. 17, unlike the dummy dam members DDM1 and DDM2 shown in FIG. 12, the dummy dam members DDM1' and DDM2' may be disposed on the third insulating layer INS3 between the boundary of the third insulating layer INS3 and the boundary of the second encapsulation layer EN2.

The dummy dam members DDM1' and DDM2' may have a size smaller than the dummy dam members DDM1 and DDM2 shown in FIG. 12, but may have the same structures as those of the dummy dam members DDM1 and DDM2. For example, the dummy dam members DDM1' and DDM2' may include the protruding portions P1, P2, P1_1, P2_1, P1_2, P2_2, P1_3, and P2_3 having the rectangular shape, the triangular shape, the semicircular shape, or the rectangular shapes of different sizes as the dummy dam members DDM1, DDM2, DDM1_1, DDM2_1, DDM1_2, DDM2_2, DDM1_3, and DDM2_3 shown in FIGS. 13, 14, 15, and 16. The first and second dummy dam members DDM1' and DDM2' may have a thickness in a range of about 2 micrometers ($\mu m$) to about 5 micrometers ($\mu m$). The first and second dummy dam members DDM1' and DDM2' may have a width greater than or equal to about 10 micrometers ($\mu m$). Of course other dimensions may be used depending upon the particular application.

Figure 18:
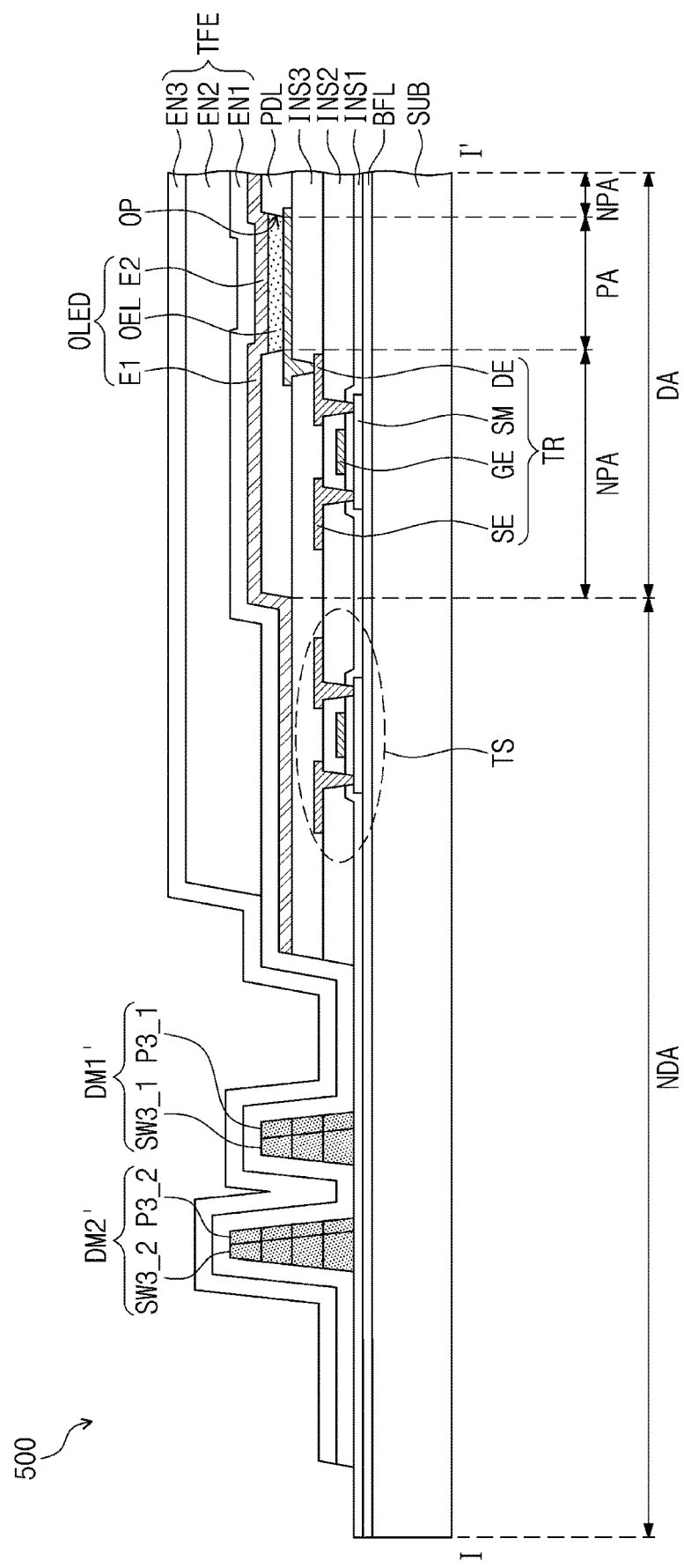
FIG. 18 is a cross-sectional view illustrating a display apparatus constructed according to a fifth exemplary embodiment of the invention.
Figure 19:
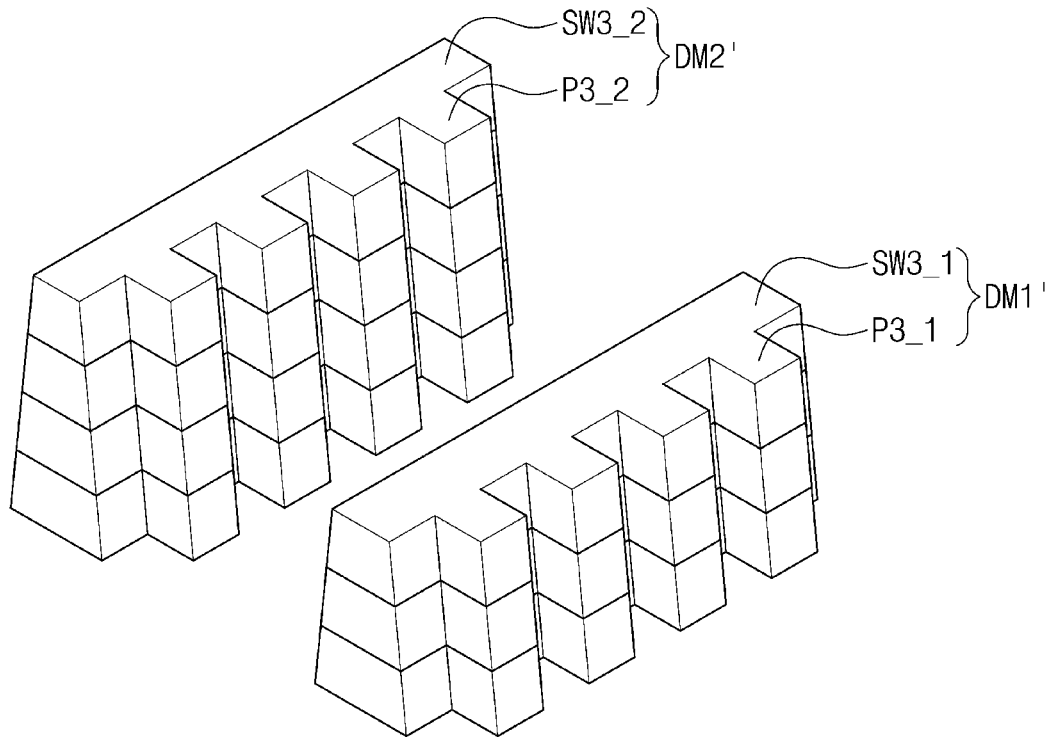
FIG. 19 is a perspective view illustrating first and second dam members shown in FIG. 18.
Figure 20:
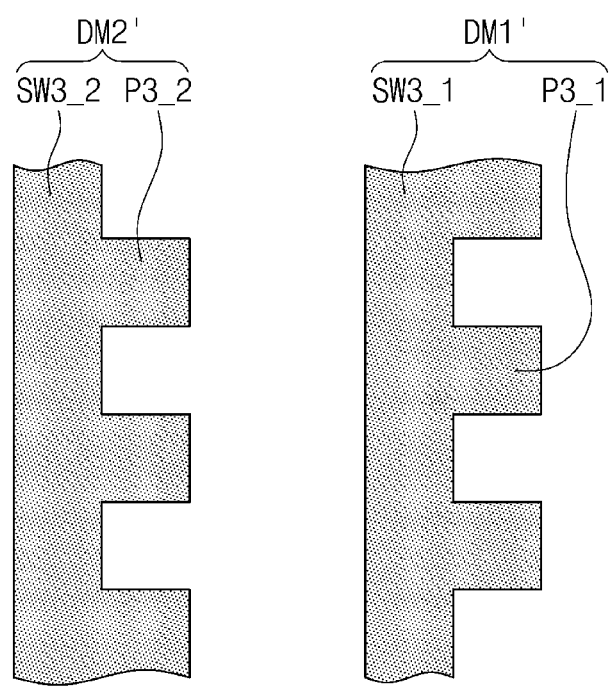
FIG. 20 is a plan view illustrating the first and second dam members illustrated in FIG. 19.

FIG. 18 is a cross-sectional view illustrating a display apparatus 500 constructed according to a fifth exemplary embodiment of the invention. FIG. 19 is a perspective view illustrating first and second dam members DM1' and DM2' shown in FIG. 18. FIG. 20 is a plan view illustrating first and second dam members DM1' and DM2' illustrated in FIG. 19.

For the convenience of explanation, FIG. 18 shows a cross-sectional view corresponding to the cross-sectional view shown in FIG. 4. The display apparatus 500 according to the fifth exemplary embodiment may have substantially the same configuration as that of the display apparatus 100 shown in FIG. 4 except that the dummy dam member DDM is not included in the display apparatus 500 and configurations of first and second dam members DM1' and DM2'. Accordingly, the configurations of the first and second dam members DM1' and DM2' of the display apparatus 500 will be mainly described, and descriptions of the other configurations of the display apparatus 500 that are substantially the same as the display apparatus 100 shown in FIG. 4 will be omitted to avoid redundancy. Additionally, in FIG. 18, the same reference numerals denote the same elements as those in FIG. 4.

Referring to FIG. 18, FIG. 19, and FIG. 20, the first dam member DM1' may be disposed between the second dam member DM2' and the display area DA, and the second dam member DM2' may be disposed adjacent to the edge of the substrate SUB.

The first dam member DM1' may include a first side wall portion SW3_1 extending to surround the display area DA and first protruding portions P3_1 extending from one side of the first side wall portion SW3_1 toward the display area DA. The second dam member DM2' may include a second side wall portion SW3_2 extending to surround the display area DA and second protruding portions P3_2 extending from one side of the second side wall portion SW3_2 toward the display area DA.

A stacked structure of the first and second dam members DM1' and DM2' may be substantially the same as that of the first and second dam members DM1 and DM2 shown in FIG. 4. Accordingly, for the convenience of explanation, reference numerals of configurations of the first and second dam members DM1' and DM2' are omitted in FIG. 18 and FIG. 19.

As shown in FIG. 20, the first protruding portions P3_1 may be alternately arranged so as to be staggered with the second protruding portions P3_2. For the convenience of explanation, FIG. 20 shows only a structure of an uppermost layer of each of the first and second dam members DM1' and DM2'. Since a surface area of one side of each of the first and second dam members DM1' and DM2' increases due to the first protruding portions P3_1 and the second protruding portions P3_2, excess organic material may be blocked more effectively.

According to the principles and exemplary embodiments of the invention, the display apparatus may include the dam members adjacent to the edge of the display panel and the dummy dam member including the holes defined in the dummy dam member. When the organic material provided to form a component such as a second encapsulation layer of a thin film encapsulation layer is excessively provided on the substrate, the excess organic material may be accommodated or contained in the holes of the dummy dam members and grooves between the dam members. Thus, the excess organic material may be effectively blocked or limited without overflowing the substrate or causes defects in other components.

Although certain exemplary embodiments and implementations have been described herein, other embodiments and modifications will be apparent from this description. Accordingly, the exemplary embodiments are not limited thereto, but rather to the broader scope of the appended claims and various obvious modifications and equivalent arrangements as would be apparent to a person of ordinary skill in the art.

What is claimed is:

1. A display apparatus comprising:
   a substrate having a display area and a non-display area at least partially surrounding the display area;
   a plurality of pixels disposed in the display area of the substrate;
   a plurality of first members disposed in the non-display area of the substrate extending along an edge of the substrate; and
   a plurality of second members disposed on the substrate between the plurality of first members and the display area, each of the plurality of second members comprising:
   a side wall portion extending to surround the display area; and
   a plurality of protruding portions projecting from one side of the side wall portion facing the display area.

2. The display apparatus of claim 1, wherein each of the plurality of protruding portions has at least one shape of a rectangular shape, a triangular shape, and a semicircular shape.

3. The display apparatus of claim 1, wherein adjacent protruding portions have different sizes from each other.

4. The display apparatus of claim 1, wherein the plurality of second members comprises a plurality of dummy dam members, and the plurality of first members comprise a plurality of dam members, each of the plurality of dam members comprising:
   a first dam member having a height higher than a height of each of the plurality of dummy dam members; and
   a second dam member having a height higher than the height of the first dam member,
   wherein the second dam member is disposed adjacent to the edge of the substrate, and
   wherein the first dam member is disposed between the plurality of dummy dam members and the second dam member.

5. The display apparatus of claim 4, wherein each of the plurality of dummy dam members has a thickness in a range of about 2 micrometers (μm) to about 5 micrometers (μm), wherein the thickness of each of the plurality of dummy dam members is defined by a distance between a bottom surface and a top surface of each of the plurality of dummy dam members, and
    wherein each of the plurality of dummy dam members has a width greater than or equal to about 10 micrometers (μm), wherein the width of each of the plurality of dummy dam members is defined by a distance between one side surface and the other side surface of each of the plurality of dummy dam members.

6. The display apparatus of claim 1, wherein the plurality of second members comprise a plurality of dummy dam members, each of which comprises:
    a first dummy dam member; and
    a second dummy dam member disposed between the first dummy dam member and the plurality of dam members,
    wherein the plurality of protruding portions of the first dummy dam member are alternately arranged with the plurality of protruding portions of the second dummy dam member.

7. The display apparatus of claim 1, further comprising:
    an insulating layer disposed in the display area of the substrate and extending to the non-display area adjacent to the plurality of second members; and
    a thin film encapsulation layer covering the plurality of pixels,
    wherein the plurality of pixels comprises:
        a plurality of transistors disposed on the substrate; and
        a plurality of light emitting elements connected to the plurality of transistors,
    wherein the insulating layer is disposed on the plurality of transistors,
    wherein the plurality of light emitting elements are disposed on the insulating layer and connected to the plurality of transistors through a plurality of contact holes defined through the insulating layer, and
    wherein the thin film encapsulation layer is disposed on the plurality of light emitting elements.

8. The display apparatus of claim 7, wherein the thin film encapsulation layer comprises:
    a first encapsulation layer disposed on the substrate to cover the plurality of light emitting elements in the display area and the insulating layer, the plurality of second members, and the plurality of first members in the non-display area;
    a second encapsulation layer disposed on the first encapsulation layer in the display area and extending to the non-display area, the second encapsulation layer being disposed on a portion of the insulating layer adjacent to a boundary of the insulating layer in the non-display area; and
    a third encapsulation layer disposed on the first encapsulation layer to cover the second encapsulation layer.

9. The display apparatus of claim 8, wherein the plurality of second members is disposed between the boundary of the insulating layer and the plurality of first members.

10. The display apparatus of claim 8, wherein the plurality of second members is disposed on the insulating layer and between the boundary of the insulating layer and a boundary of the second encapsulation layer.

11. A display apparatus comprising:
    a substrate having a display area and a non-display area at least partially surrounding the display area;
    a plurality of pixels disposed in the display area of the substrate; and
    a plurality of first members disposed in the non-display area of the substrate extending along an edge of the substrate, the plurality of first members comprising:
        a first dam member; and
        a second dam member having a height higher than a height of the first dam member,
        wherein each of the first and second dam members comprises:
            a side wall portion extending to surround the display area; and
            a plurality of protruding portions extending from one side of the side wall portion facing the display area, wherein at least one of the side wall portion and the protruding portions are configured to limit flow or excessive organic material during manufacture.

12. The display apparatus of claim 11,
    wherein the second dam member is disposed adjacent to the edge of the substrate,
    wherein the first dam member is disposed between the display area and the second dam member, and
    wherein the plurality of protruding portions of the first dam member are staggered in a transverse direction with the plurality of protruding portions of the second dam member.

13. A display apparatus comprising:
    a substrate having a display area and a non-display area at least partially surrounding the display area;
    a plurality of pixels disposed in the display area of the substrate;
    a plurality of first members disposed in the non-display area of the substrate extending along an edge of the substrate; and
    a second member disposed on the substrate between the plurality of first members and the display area, the second member comprising:
        a side wall portion extending to surround the display area; and
        a plurality of protruding portions projecting from one side of the side wall portion facing the display area.

14. The display apparatus of claim 13, wherein the second member is provided in plurality.

15. The display apparatus of claim 14, the plurality of second members comprises a plurality of dummy dam members, and the plurality of first members comprise a plurality of dam members, each of the plurality of dam members comprising:
    a first dam member having a height higher than a height of each of the plurality of dummy dam members; and
    a second dam member having a height higher than the height of the first dam member,
    wherein the second dam member is disposed adjacent to the edge of the substrate, and
    wherein the first dam member is disposed between the plurality of dummy dam members and the second dam member.

16. The display apparatus of claim 15, wherein each of the plurality of dummy dam members has a thickness in a range of about 2 micrometers (μm) to about 5 micrometers (μm), wherein the thickness of each of the plurality of dummy dam members is defined by a distance between a bottom surface and a top surface of each of the plurality of dummy dam members, and
    wherein each of the plurality of dummy dam members has a width greater than or equal to about 10 micrometers (μm), wherein the width of each of the plurality of dummy dam members is defined by a distance between one side surface and the other side surface of each of the plurality of dummy dam members.

17. The display apparatus of claim 14, wherein the plurality of second members comprise a plurality of dummy dam members, each of which comprises:
  a first dummy dam member; and
  a second dummy dam member disposed between the first dummy dam member and the plurality of dam members,
  wherein the plurality of protruding portions of the first dummy dam member are alternately arranged with the plurality of protruding portions of the second dummy dam member.

18. The display apparatus of claim 14, further comprising:
  an insulating layer disposed in the display area of the substrate and extending to the non-display area adjacent to the plurality of second members; and
  a thin film encapsulation layer covering the plurality of pixels,
  wherein the plurality of pixels comprises:
    a plurality of transistors disposed on the substrate; and
    a plurality of light emitting elements connected to the plurality of transistors,
  wherein the insulating layer is disposed on the plurality of transistors,
  wherein the plurality of light emitting elements are disposed on the insulating layer and connected to the plurality of transistors through a plurality of contact holes defined through the insulating layer, and
  wherein the thin film encapsulation layer is disposed on the plurality of light emitting elements.

19. The display apparatus of claim 18, wherein the thin film encapsulation layer comprises:
  a first encapsulation layer disposed on the substrate to cover the plurality of light emitting elements in the display area and the insulating layer, the plurality of second members, and the plurality of first members in the non-display area;
  a second encapsulation layer disposed on the first encapsulation layer in the display area and extending to the non-display area, the second encapsulation layer being disposed on a portion of the insulating layer adjacent to a boundary of the insulating layer in the non-display area; and
  a third encapsulation layer disposed on the first encapsulation layer to cover the second encapsulation layer.

20. The display apparatus of claim 13, wherein adjacent protruding portions have different sizes from each other.

* * * * *